(12) United States Patent
Burry et al.

(10) Patent No.: US 12,272,523 B2
(45) Date of Patent: Apr. 8, 2025

(54) EXTREMUM-SEEKING CONTROL APPARATUSES AND METHODS FOR AUTOMATIC FREQUENCY TUNING

(71) Applicant: MKS Instruments, Inc., Andover, MA (US)

(72) Inventors: Aaron Burry, Ontario, NY (US); Vladimir Kozitsky, Rochester, NY (US)

(73) Assignee: MKS Instruments, Inc., Andover, MA (US)

( * ) Notice: Subject to any disclaimer, the term of this patent is extended or adjusted under 35 U.S.C. 154(b) by 392 days.

(21) Appl. No.: 17/903,749

(22) Filed: Sep. 6, 2022

(65) Prior Publication Data

US 2024/0079211 A1 Mar. 7, 2024

(51) Int. Cl.
*H01J 37/32* (2006.01)
*H03K 5/00* (2006.01)

(52) U.S. Cl.
CPC .... *H01J 37/32183* (2013.01); *H03K 5/00006* (2013.01)

(58) Field of Classification Search
None
See application file for complete search history.

(56) References Cited

U.S. PATENT DOCUMENTS

| | | | |
|---|---|---|---|
| 7,602,127 B2 | 10/2009 | Coumou | |
| 8,110,991 B2 | 2/2012 | Coumou | |
| 8,395,322 B2 | 3/2013 | Coumou | |
| 8,741,095 B2 | 6/2014 | Koshimizu | |
| 9,508,529 B2 | 11/2016 | Valcore, Jr. et al. | |
| 10,049,857 B2 | 8/2018 | Fisk, II et al. | |
| 10,269,540 B1 | 4/2019 | Carter et al. | |
| 10,546,724 B2 | 1/2020 | Radomski et al. | |
| 10,741,363 B1 * | 8/2020 | Burry | H03H 7/40 |
| 10,821,542 B2 | 11/2020 | Nelson et al. | |

(Continued)

FOREIGN PATENT DOCUMENTS

KR 10-2017-0052062 A 5/2017

OTHER PUBLICATIONS

International Search Report and Written Opinion of the ISA issued in PCT/US2023/024564, mailed Sep. 22, 2023; ISA/US.

(Continued)

*Primary Examiner* — Wilson Lee

(57) ABSTRACT

A RF generator includes a RF power source configured to generate an output signal at an output frequency, and an extremum-seeking frequency controller configured to generate a frequency control signal. The frequency control signal varies the output frequency of the RF power source, and the frequency control signal is formed from a gradient signal. The RF generator further includes a gradient estimator configured to generate the gradient signal. A frequency of the frequency control signal is adjusted based on the gradient signal. The gradient estimator is configured to receive frequency values of the frequency control signal and corresponding output response values, and the gradient signal is generated based on the frequency values and the output response values. Other example RF generators, methods for extremum-seeking frequency control of a RF generator, and control systems for controlling a RF generator are also disclosed.

34 Claims, 15 Drawing Sheets

(56) References Cited

U.S. PATENT DOCUMENTS

| | | | | |
|---|---|---|---|---|
| 2020/0343074 A1* | 10/2020 | Alizadeh | .............. | H05H 1/4697 |
| 2021/0066044 A1* | 3/2021 | Kitamura | .......... | H01L 21/67069 |
| 2021/0142989 A1* | 5/2021 | Iizuka | ................. | H01L 21/3065 |
| 2021/0191451 A1* | 6/2021 | Gajda | .................... | H03L 1/026 |
| 2022/0084795 A1* | 3/2022 | Collins | .............. | H01L 21/6719 |

OTHER PUBLICATIONS

Taiwanese Office Action regarding Patent Application No. 112122279. dated Nov. 18, 2024.

\* cited by examiner

EXTREMUM-SEEKING CONTROL APPARATUSES AND METHODS FOR AUTOMATIC FREQUENCY TUNING

FIELD

The present disclosure relates to RF generator systems and to control of RF generators.

BACKGROUND

Plasma fabrication is frequently used in semiconductor fabrication. In plasma fabrication, ions are accelerated by an electric field to etch material from or deposit material onto a surface of a substrate. In one basic implementation, the electric field is generated based on Radio Frequency (RF) or Direct Current (DC) power signals generated by a respective RF or DC generator of a power delivery system. The power signals generated by the generator must be precisely controlled to effectively execute plasma etching.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

According to one aspect of the present disclosure, a radio frequency (RF) generator for powering a load is disclosed. The RF generator includes a RF power source configured to generate an output signal at an output frequency, and an extremum-seeking frequency controller configured to generate a frequency control signal, the frequency control signal varying the output frequency of the RF power source, the frequency control signal is formed from a gradient signal. The RF generator further includes a gradient estimator configured to generate the gradient signal. A frequency of the frequency control signal is adjusted based on the gradient signal. The gradient estimator is configured to receive frequency values of the frequency control signal and corresponding output response values. The gradient signal is generated based on the frequency values and the output response values. Other embodiments of this aspect include corresponding computer systems, apparatus, and computer programs recorded on one or more computer storage devices, each configured to perform the actions of the methods.

Implementations may include one or more of the following features. The RF generator may include a first buffer configured to store the frequency values and a second buffer configured to store the output response values. The first buffer and the second buffer may be configured to purge at least one of the frequency values and at least one of the output response values. The first buffer and the second buffer may be configured to store a defined number of the frequency values and the output response values. The defined number may be a number from five to twenty. The RF generator may further include a power controller coupled to the RF power source. The power controller may be configured to generate a pulse to modulate the output signal of the RF power source, and where the first buffer and the second buffer may be configured to store the frequency values and the output response values for the pulse. The power controller may be configured to generate a pulse to modulate the output signal of the RF power source, where the includes a first state and a second state, and where the first buffer and the second buffer are configured to store the frequency values and the output response values for the first state of the pulse. The RF generator may include a third buffer configured to store the frequency values for the second state of the pulse and a fourth buffer configured to store the output response values for the second state of the pulse. The first buffer and the second buffer may be configured to purge at least one of the frequency values and at least one of the output response values for the first state of the pulse, and the first buffer and the second buffer may be configured to store the frequency values and the output response values for the second state of the pulse after purging the at least one of the frequency values and the at least one of the output response values for the first state of the pulse. The pulse may be a first pulse, the power controller may be configured to generate a second pulse including the first state and the second state, and the at least one of the frequency values and the at least one of the output response values purged for the first state of the first pulse may be recalled into the first buffer and the second buffer for the first state of the second pulse. The gradient estimator may be configured to estimate a gradient of a cost function of the rf generator based on the frequency values and the output response values, and the gradient estimator may be configured to generate the gradient signal based on the estimated gradient. The gradient estimator may be configured to estimate the gradient based on a minimum value of the output response values, a maximum value of the output response values, one of the frequency values corresponding to the minimum value of the output response values, and another one of the frequency values corresponding to the maximum value of the output response values. The gradient estimator may be configured to estimate the gradient based on a sum of the frequency values and a sum of the output response values. The gradient estimator may be configured to set the estimated gradient to zero in response to the estimated gradient being less than or equal to a defined threshold value. The gradient estimator may be configured to estimate the gradient again based on at least one of: one of the output response values corresponding to when the estimated gradient was set to zero, one or more defined operating parameters of the rf generator, or a perturbation signal. The gradient estimator may be configured to clamp the estimated gradient to a defined threshold value in response to the estimated gradient being less than or equal to the defined threshold value. The gradient estimator may be configured to estimate a gradient at startup of the RF generator based on one or more defined operating parameters of the RF generator or a perturbation signal, and the gradient estimator may be configured to generate the gradient signal based on the estimated gradient. Implementations of the described techniques may include hardware, a method or process, or computer software on a computer-accessible medium.

According to another aspect of the present disclosure, a method for extremum-seeking frequency control of a RF generator including a RF power source is disclosed. The method includes generating a frequency control signal having an adjustable frequency, the frequency control signal varying an output frequency of the RF power source, receiving frequency values of the frequency control signal and corresponding output response values, and generating a gradient signal based on the frequency values and the output response values, where a frequency of the frequency control signal is adjusted based on the gradient signal. Other embodiments of this aspect include corresponding computer systems, apparatus, and computer programs recorded on one or more computer storage devices, each configured to perform the actions of the methods.

Implementations may include one or more of the following features. The method may include storing the frequency values in a first buffer and the output response values in a second buffer. The method may include purging at least one of the frequency values in the first buffer and at least one of the output response values in the second buffer. Storing the frequency values in a first buffer and the output response values in a second buffer may include storing a defined number of the frequency values in the first buffer and a defined number of the output response values in the second buffer. The defined number may be a number from five to twenty. The method may include generating a pulse to modulate an output signal of the RF power source, where storing the frequency values in the first buffer and the output response values in the second buffer may include storing the frequency values and the output response values for the pulse. The method may include generating a pulse to modulate an output signal of the RF power source, where storing the frequency values in the first buffer and the output response values in the second buffer may include storing the frequency values and the output response values for the first state of the pulse. The method may include storing the frequency values for the second state of the pulse in a third buffer and the output response values for the second state of the pulse in a fourth buffer. The method may include purging at least one of the frequency values in the first buffer and at least one of the output response values in the second buffer, and storing the frequency values in the first buffer and the output response values in the second buffer for the second state of the pulse after purging the at least one of the frequency values and the at least one of the output response values for the first state of the pulse. The pulse may be a first pulse and the method may further include generating a second pulse including the first state and the second state, and recalling the at least one of the frequency values and the at least one of the output response values purged for the first state of the first pulse into the first buffer and the second buffer for the first state of the second pulse. The method may further include estimating a gradient of a cost function of the RF generator based on the frequency values and the output response values, where generating the gradient signal includes generating the gradient signal based on the estimated gradient. Estimating the gradient may include estimating the gradient based on a minimum value of the output response values, a maximum value of the output response values, one of the frequency values corresponding to the minimum value of the output response values, and another one of the frequency values corresponding to the maximum value of the output response values. Estimating the gradient may include estimating the gradient based on a sum of the frequency values and a sum of the output response values. The method may further include setting the estimated gradient to zero in response to the estimated gradient being less than or equal to a defined threshold value. The method may further include estimating the gradient again based on at least one of: one of the output response values corresponding to when the estimated gradient was set to zero, one or more defined operating parameters of the rf generator, or a perturbation signal. The method may include clamping the estimated gradient to a defined threshold value in response to the estimated gradient being less than or equal to the defined threshold value. The method may further include estimating a gradient at startup of the RF generator based on one or more defined operating parameters of the RF generator or a perturbation signal, where generating the gradient signal includes generating the gradient signal based on the estimated gradient. Implementations of the described techniques may include hardware, a method or process, or computer software on a computer-accessible medium.

According to another aspect of the present of the present disclosure, a control system for controlling a RF generator including a rf power source is disclosed. The control system includes an extremum-seeking frequency controller configured to generate a frequency control signal, the frequency control signal varying an output frequency of the RF power source, the frequency control signal is formed from a gradient signal. The control system further includes a gradient estimator configured to generate the gradient signal. A frequency of the frequency control signal is adjusted based on the gradient signal. The gradient estimator is configured to receive frequency values of the frequency control signal and corresponding output response values. The gradient signal is generated based on the frequency values and the output response values. Other embodiments of this aspect include corresponding computer systems, apparatus, and computer programs recorded on one or more computer storage devices, each configured to perform the actions of the methods.

Implementations may include one or more of the following features. The control system may include a first buffer configured to store the frequency values and a second buffer configured to store the output response values. The first buffer and the second buffer may be configured to purge at least one of the frequency values and at least one of the output response values. The first buffer and the second buffer may be configured to store a defined number of the frequency values and the output response values. The defined number may be a number from five to twenty. The control system may include a power controller configured to generate a pulse to modulate an output signal of the RF power source, where the first buffer and the second buffer may be configured to store the frequency values and the output response values for the pulse. The control system may include a power controller configured to generate a pulse to modulate an output signal of the RF power source, where the pulse includes a first state and a second state and where the first buffer and the second buffer may be configured to store the frequency values and the output response values for the first state of the pulse. The control system may include a third buffer configured to store the frequency values for the second state of the pulse and a fourth buffer configured to store the output response values for the second state of the pulse. The first buffer and the second buffer may be configured to purge at least one of the frequency values and at least one of the output response values for the first state of the pulse and the first buffer and the second buffer may be configured to store the frequency values and the output response values for the second state of the pulse after purging the at least one of the frequency values and the at least one of the output response values for the first state of the pulse. The pulse may be a first pulse, the power controller may be configured to generate a second pulse including the first state and the second state, and the at least one of the frequency values and the at least one of the output response values purged for the first state of the first pulse may be recalled into the first buffer and the second buffer for the first state of the second pulse. The gradient estimator may be configured to estimate a gradient of a cost function of the RF generator based on the frequency values and the output response values, and the gradient estimator may be configured to generate the gradient signal based on the estimated gradient. The gradient estimator may be configured to estimate the gradient based on a minimum value of the output response values, a maximum value of the output response values, one of the frequency values corresponding to the minimum value of the output response values, and another one of the frequency values corresponding to the maximum value of the output response values. The gradient estimator may be configured to estimate the gradient based on a sum of the frequency values and a sum of the output response values. The gradient estimator may be configured to set the estimated gradient to zero in response to the estimated gradient being less than or equal to a defined threshold value. The gradient estimator may be configured to estimate the gradient again based on at least one of: one of the output response values corresponding to when the estimated gradient was set to zero, one or more defined operating parameters of the RF generator, or a perturbation signal. The gradient estimator may be configured to clamp the estimated gradient to a defined threshold value in response to the estimated gradient being less than or equal to the defined threshold value. The gradient estimator may be configured to estimate a gradient at startup of the RF generator based on one or more defined operating parameters of the RF generator or a perturbation signal, and the gradient estimator may be configured to generate the gradient signal based on the estimated gradient. Implementations of the described techniques may include hardware, a method or process, or computer software on a computer-accessible medium.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

Figure 1:
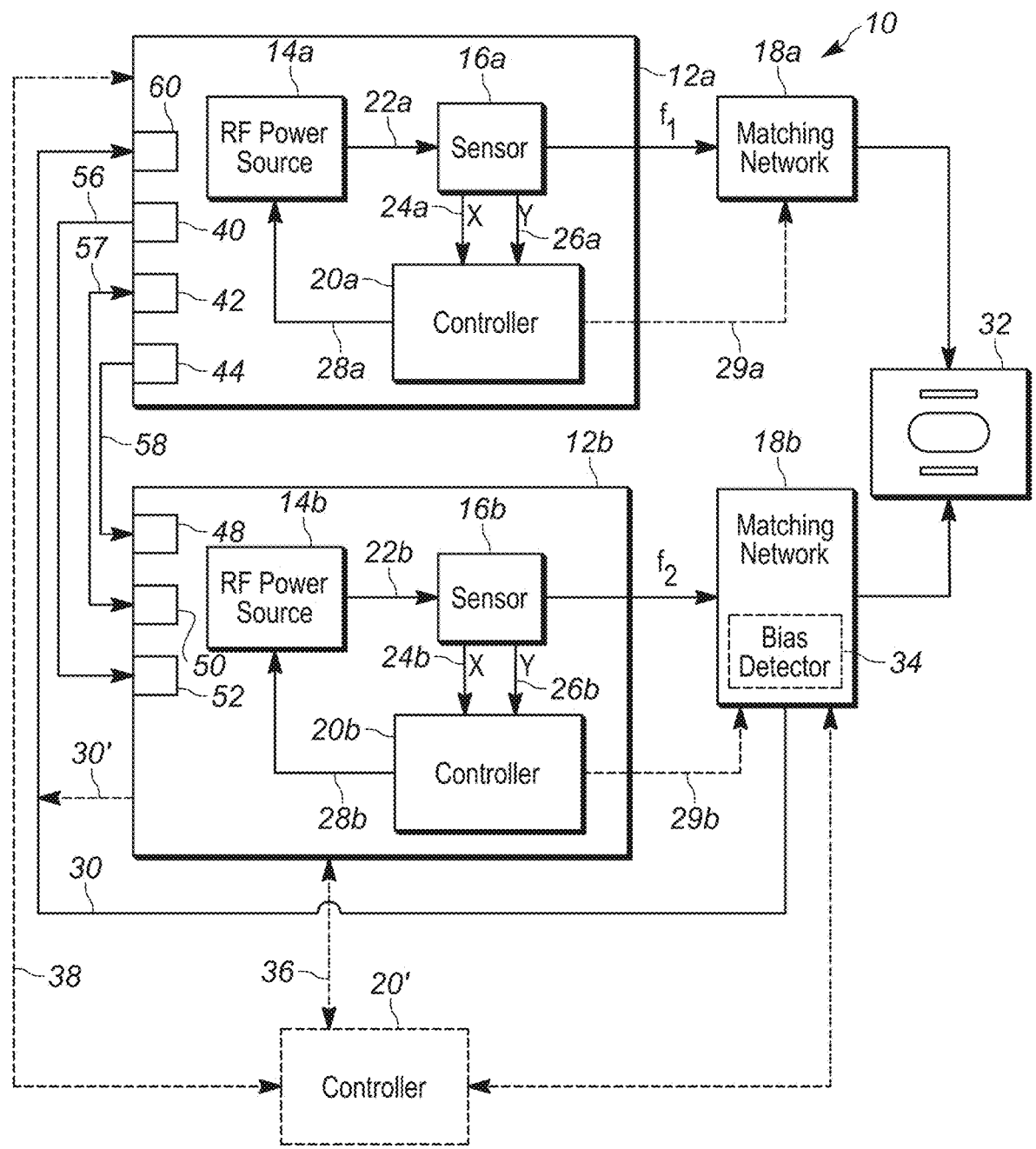
FIG. 1 is a schematic block diagram of a power delivery system having multiple power supplies arranged according to various configurations of the present disclosure.

A power system may include a DC or RF power generator or DC or RF generator, a matching network, and a load (such as a process chamber, a plasma chamber, or a reactor having a fixed or variable impedance). The power generator generates a DC or RF power signal, which is received by the matching network or impedance optimizing controller or circuit. The matching network or impedance optimizing controller or circuit matches an input impedance of the matching network to a characteristic impedance of a transmission line between the power generator and the matching network. The impedance matching aids in maximizing an amount of power forwarded to the matching network ("forward power") and minimizing an amount of power reflected back from the matching network to the power generator ("reverse power" or "reflected power"). Delivered power to the load may be maximized by minimizing reflected power when the input impedance of the matching network matches the characteristic impedance of the transmission line and generator.

In the power source or power supply field, there are typically two approaches to applying a power signal to the load. A first, more traditional approach is to apply a continuous power signal to the load. In a continuous mode or continuous wave mode, a continuous power signal is typically a constant DC or sinusoidal RF power signal that is output continuously by the power source to the load. In the continuous mode approach, the power signal assumes a constant DC or sinusoidal output, and the amplitude of the power signal and/or frequency (of a RF power signal) can be varied in order to vary the output power applied to the load.

A second approach to applying the power signal to the load involves pulsing a RF signal, rather than applying a continuous RF signal to the load. In a pulse or pulsed mode of operation, a RF signal is modulated by a modulation signal in order to define an envelope for the modulated power signal. The RF signal may be, for example, a sinusoidal RF signal or other time varying signal. Power delivered to the load is typically varied by varying the modulation signal.

In a typical power supply configuration, output power applied to the load is determined using sensors that measure the forward and reflected power or the voltage and current of the RF signal applied to the load. Either set of these signals is analyzed in a control loop. The analysis typically determines a power value which is used to adjust the output of the power supply in order to vary the power applied to the load. In a power delivery system where the load is a process chamber or other non-linear or time varying load, the varying impedance of the load causes a corresponding varying of power applied to the load, as applied power is in part a function of the impedance of the load.

In systems where fabrication of various devices relies upon introduction of power to a load to control a fabrication process, power is typically delivered in one of two configurations. In a first configuration, the power is capacitively coupled to the load. Such systems are referred to as capacitively coupled plasma (CCP) systems. In a second configuration, the power is inductively coupled to the load. Such systems are typically referred to as inductively coupled plasma (ICP) systems. Power coupling to the plasma can also be achieved via wave coupling at microwave frequencies. Such an approach typically uses Electron Cyclotron Resonance (ECR) or microwave sources. Helicon sources are another form of wave coupled source and typically operate at RF frequencies similar to that of conventional ICP and CCP systems. Power delivery systems may include at least one bias power and/or a source power applied to one or a plurality of electrodes of the load. The source power typically generates a plasma and controls plasma density, and the bias power modulates ions in the formulation of the sheath. The bias and the source may share the same electrode or may use separate electrodes, in accordance with various design considerations.

When a power delivery system drives a time-varying or non-linear load, such as a process chamber or plasma chamber, the power absorbed by the bulk plasma and plasma sheath results in a density of ions with a range of ion energy. One characteristic measure of ion energy is the ion energy distribution function (IEDF). The IEDF can be controlled with the bias power. One way of controlling the IEDF for a system in which multiple RF power signals are applied to the load occurs by varying multiple RF signals that are related by amplitude, frequency and phase. The relative amplitude, frequency, and phase of multiple RF power signals may also be related by a Fourier series and the associated coefficients. The frequencies between the multiple RF power signals may be locked, and the relative phase between the multiple RF signals may also be locked. Examples of such systems can be found with reference to U.S. Pat. Nos. 7,602,127; 8,110,991; and 8,395,322, all assigned to the assignee of the present application and incorporated by reference in this application.

Time varying or non-linear loads may be present in various applications. In one application, plasma processing systems may also include components for plasma generation and control. One such component is a non-linear load implemented as a process chamber, such as a plasma chamber or reactor. A typical plasma chamber or reactor utilized in plasma processing systems, such as by way of example, for thin-film manufacturing, can utilize a dual power system. One power generator (the source) controls the generation of the plasma, and the power generator (the bias) controls ion energy. Examples of dual power systems include systems that are described in U.S. Pat. Nos. 7,602,127; 8,110,991; and 8,395,322, referenced above. The dual power system described in the above-referenced patents employs a closed-loop control system to adapt power supply operation for the purpose of controlling ion density and its corresponding ion energy distribution function (IEDF).

Multiple approaches exist for controlling a process chamber, such as may be used for generating plasmas. For example, in RF power delivery systems, phase and frequency of multiple driving RF signals operating at the same or nearly the same frequency may be used to control plasma generation. For RF driven plasma sources, the periodic waveform affecting plasma sheath dynamics and the corresponding ion energy are generally known and are controlled by the frequency of the periodic waveforms and the associated phase interaction. Another approach in RF power delivery systems involves dual frequency control. That is, two RF frequency sources operating at different frequencies are used to power a plasma chamber to provide substantially independent control of ion and electron densities.

Another approach utilizes wideband RF power sources to drive a plasma chamber. A wideband approach presents certain challenges. One challenge is coupling the power to the electrode. A second challenge is that the transfer function of the generated waveform to the actual sheath voltage for a desired IEDF must be formulated for a wide process space to support material surface interaction. In one responsive approach in an inductively coupled plasma system, controlling power applied to a source electrode controls the plasma density while controlling power applied to the bias electrode modulates ions to control the IEDF to provide etch rate control. By using source electrode and bias electrode control, the etch rate is controlled via the ion density and energy.

As integrated circuit and device fabrication continues to evolve, so do the power requirements for controlling the process for fabrication. For example, with memory device fabrication, the requirements for bias power continue to increase. Increased power generates higher energetic ions for faster surface interaction, thereby increasing the etch rate and directionality of ions. In RF systems, increased bias power is sometimes accompanied by a lower bias frequency requirement along with an increase in the number of bias power sources coupled to the plasma sheath created in the plasma chamber. The increased power at a lower bias frequency and the increased number of bias power sources results in intermodulation distortion (IMD) emissions from a sheath modulation. The IMD emissions can significantly reduce power delivered by the source where plasma generation occurs. U.S. Pat. No. 10,821,542, issued Nov. 3, 2020 and entitled Pulse Synchronization by Monitoring Power in Another Frequency Band, assigned to the assignee of the present application and incorporated by reference herein, describes a method of pulse synchronization by monitoring power in another frequency band. In the referenced U.S. patent application, the pulsing of a second RF generator is controlled in accordance with detecting at the second RF generator the pulsing of a first RF generator, thereby synchronizing pulsing between the two RF generators.

FIG. 1 depicts a RF generator or power supply system 10. Power supply system 10 includes a pair of radio frequency (RF) generators or power supplies 12a, 12b, matching networks 18a, 18b, and load 32, such as a non-linear load, which may be a plasma chamber, plasma reactor, process chamber, and the like. In various configurations, RF generator 12a is referred to as a source RF generator or power supply, and matching network 18a is referred to as a source matching network. Also in various configurations, RF generator 12b is referred to as a bias RF generator or power supply, and matching network 18b is referred to as a bias matching network. It will be understood that the components can be referenced individually or collectively using the reference number with and without a letter, subscript, or a prime symbol.

In various configurations, source RF generator 12a receives a control signal 30 from matching network 18b and/or a control signal 30' from bias RF generator 12b. Control signal 30 or 30' represents an input signal to source RF generator 12a that indicates one or more operating characteristics or parameters of bias RF generator 12b. In various configurations, a synchronization bias detector 34 senses the RF signal output from matching network 18b to load 32 and outputs synchronization or trigger signal 30 to source RF generator 12a. In various configurations, synchronization or trigger signal 30' may be output from bias RF generator 12b to source RF generator 12a, rather than trigger signal 30. One difference between trigger or synchronization signals 30, 30' may result from the effect of matching network 18b, which can vary the phase between the input signal to and output signal from matching network. Signals 30, 30' include information about the operation of bias RF generator 12b that in various configurations enables predictive responsiveness to address periodic fluctuations in the impedance of load 32 caused by the bias RF generator 12b. When control signals 30 or 30' are absent, RF generators 12a, 12b operate autonomously.

RF generators 12a, 12b include respective RF power sources or amplifiers 14a, 14b, sensors 16a, 16b, and processors, controllers, or control modules 20a, 20b. RF power sources 14a, 14b generate respective RF power signals 22a, 22b output to respective sensors 16a, 16b. RF power signals 22a, 22b pass through sensors 16a, 16b and are provided to matching networks 18a, 18b as respective RF power signals $f_1$ and $f_2$. While sensors 16a, 16b, are shown within respective RF generators 12a, 12b, sensors 16a, 16b can be located externally to RF power generators 12a, 12b. Such external sensing can occur at the output of the RF generator, at the input of an impedance matching device located between the RF generator and the load, or between the output of the impedance matching device (including within the impedance matching device) and the load.

Sensors 16a, 16b detect various operating parameters and output signals X and Y. Sensors 16a, 16b may include voltage, current, and/or directional coupler sensors. Sensors 16a, 16b may detect (i) voltage V and current I and/or (ii) forward power $P_{FWD}$ output from respective power amplifiers 14a, 14b and/or RF generators 12a, 12b and reverse or reflected power $P_{REV}$ received from respective matching network 18a, 18b or load 32 connected to respective sensors 16a, 16b. The voltage V, current I, forward power $P_{FWD}$, and reverse power $P_{REV}$ may be scaled, filtered, or scaled and filtered versions of the actual voltage, current, forward power, and reverse power associated with the respective power sources 14a, 14b. Sensors 16a, 16b may be analog or digital sensors or a combination thereof. In a digital implementation, the sensors 16a, 16b may include analog-to-digital (A/D) converters and signal sampling components with corresponding sampling rates. Signals X and Y can represent any of the voltage V and current I or forward (or source) power $P_{FWD}$ reverse (or reflected) power $P_{REV}$.

Sensors 16a, 16b generate sensor signals X, Y, which are received by respective power controllers or control modules 20a, 20b. Control modules 20a, 20b process the respective X, Y signals 24a, 26a and 24b, 26b and generate one or a plurality of feedforward or feedback control signals 28a, 28b to respective power sources 14a, 14b. Power sources 14a, 14b adjust the RF power signals 22a, 22b based on the received one or plurality feedback or feedforward control signals. In various configurations, control modules 20a, 10b may control matching networks 18a, 18b, respectively, via respective control signals 29a, 29b based on, for example, X, Y signals 24a, 26a and 24b, 26b. In some configurations, control signals 29a, 29b may be the same as, similar to, or different than control signals 28a, 28b. Control modules 20a, 20b may include, at least proportional-integral (PI), proportional-integral-derivative (PID) controllers, linear-quadratic-regulator (LQR), or subsets thereof and/or direct digital synthesis (DDS) component(s) and/or any of the various components described below in connection with the modules.

In various configurations, control modules 20a, 20b may include functions, processes, processors, or submodules. Control signals 28a, 28b may be control or drive signals, may communicate DC offset or rail voltage, voltage or current magnitude, frequency, and phase components, etc. In various configurations, feedback control signals 28a, 28b can be used as inputs to one or multiple control loops. In various configurations, the multiple control loops can include a control loop for RF drive, and for rail voltage. In various configurations, control signals 28a, 28b can be used in a single-input-single-output (SISO) or a multiple-input-multiple-output (MIMO) control scheme. An example of a MIMO control scheme can be found with reference to U.S. Pat. No. 10,546,724, issued on Jan. 28, 2020, entitled Pulsed Bidirectional Radio Frequency Source/Load and assigned to the assignee of the present application, and incorporated by reference herein. In other configurations, signals 28a, 28b can provide feedforward control as described in U.S. Pat. No. 10,049,857, assigned to the assignee of the present application and incorporated by reference herein.

In various configurations, power supply system 10 can include controller 20'. Controller 20' may be disposed externally to either or both of RF generators 12a, 12b and may be referred to as external or common controller 20'. In various configurations, controller 20' may implement one or a plurality of functions, processes, or algorithms described herein with respect to one or both of controllers 20a, 20b. Accordingly, controller 20' communicates with respective RF generators 12a, 12b via a pair of respective links 36, 38 which enable exchange of data and control signals, as appropriate, between controller 20' and RF generators 12a, 12b. For the various configurations, controllers 20a, 20b, 20' can distributively and cooperatively provide analysis and control of RF generators 12a, 12b. In various other configurations, controller 20' can provide control of RF generators 12a, 12b, eliminating the need for the respective local controllers 20a, 20b.

In various configurations, RF power source 14a, sensor 16a, controller 20a, and matching network 18a can be referred to as source RF power source 14a, source sensor 16a, source controller 20a, and source matching network 18a. Similarly in various configurations, RF power source 14b, sensor 16b, controller 20b, and matching network 18b can be referred to as bias RF power source 14b, bias sensor 16b, bias controller 20b, and bias matching network 18b. In various configurations and as described above, the source term refers to the RF generator that generates a plasma, and the bias term refers to the RF generator that tunes the ion potential or IEDF of the plasma. In various configurations, the source and bias RF power supplies operate at different frequencies. In various configurations, the source RF power supply operates at a higher frequency than the bias RF power supply. In various other configurations, the source and bias RF power supplies operate at the same frequencies or substantially the same frequencies.

According to various configurations, source RF generator 12a and bias RF generator 12b include multiple ports to communicate externally. Source RF generator 12a includes pulse synchronization output port 40, digital communication port 42, and RF output port 44, and control signal port 60. Bias RF generator 12b includes RF input port 48, digital communication port 50, and pulse synchronization input port 52. Pulse synchronization output port 40 outputs pulse synchronization signal 56 to pulse synchronization input port 52 of bias RF generator 12b. Digital communication port 42 of source RF generator 12a and digital communication port 50 of bias RF generator 12b communicate via digital communication link 57. Control signal port 60 of source RF generator 12a receives control signal 30 and/or 30'. RF output port 44 generates RF control signal 58 input to RF input port 48. In various configurations, RF control signal 58 is substantially the same as the RF control signal controlling source RF generator 12a. In various other configurations, RF control signal 58 is the same as the RF control signal controlling source RF generator 12a, but is phase shifted within source RF generator 12a in accordance with a requested phase shift generated by bias RF generator 12b. Thus, in various configurations, source RF generator 12a and bias RF generator 12b are driven by substantially identical RF control signals or by substantially identical RF control signal phase shifted by a predetermined amount.

Figure 2:
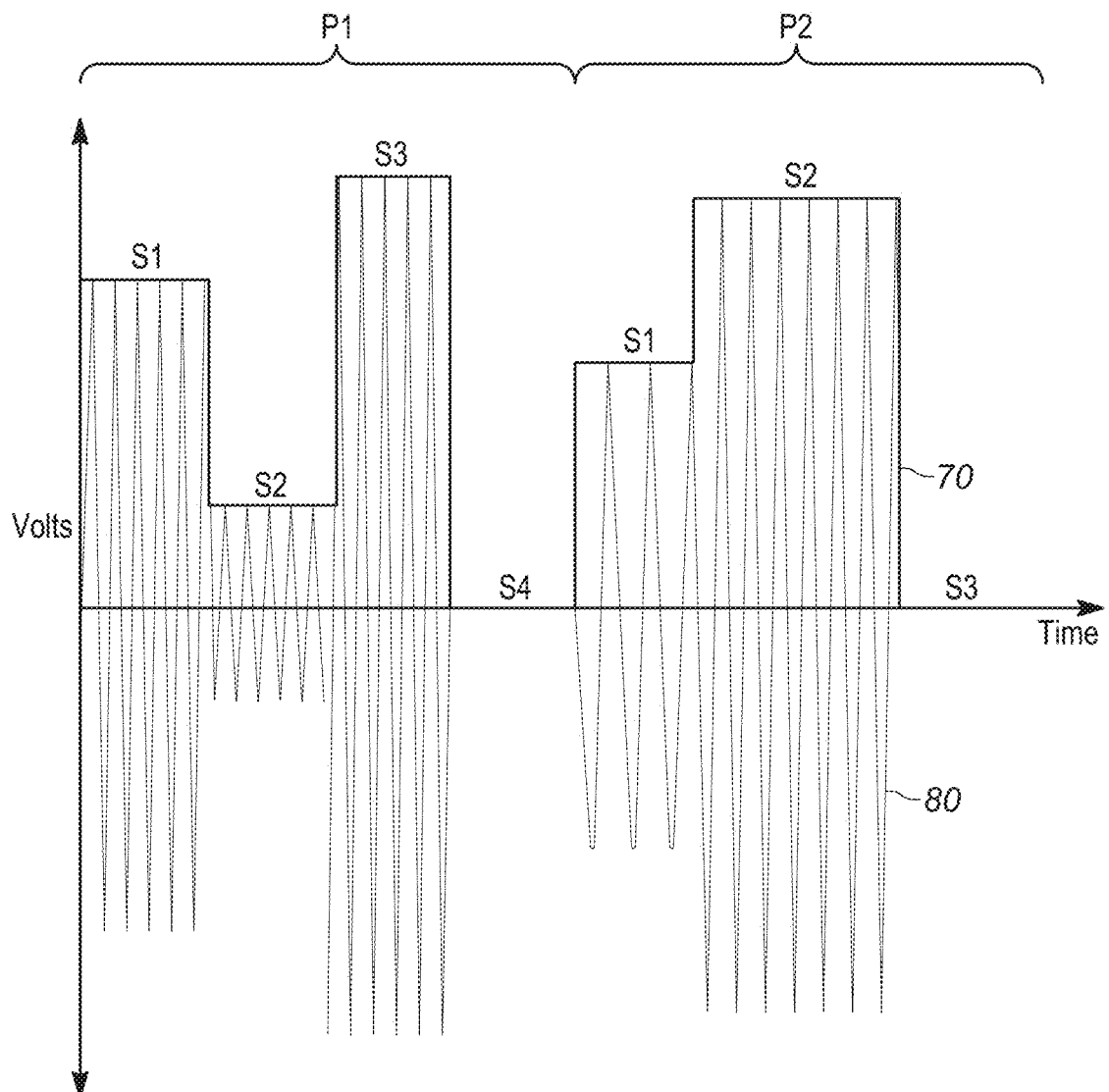
FIG. 2 shows waveforms of a RF signal and a pulse modulating the RF signal to describe a pulse mode of operation.

FIG. 2 depicts a plot of voltage versus time to describe a pulse or pulsed mode of operation for delivering power to a load, such as load 32 of FIG. 1. More particularly, FIG. 2 depicts two-multistate pulses P1, P2 of a pulse signal 70 having a respective plurality of states S1-S4 and S1-S3. In FIG. 2, RF signal 80 is modulated by pulses P1 and P2. As shown at states S1 of P1 and S1 of P2, when the pulses are ON, RF generator 12 outputs RF signal 80 having an amplitude defined by the pulse magnitude at each state. Conversely, during states S4 of P1 and S3 of P2, the pulses are OFF, and RF generator 12 does not output RF signal 80. Pulses P1, P2 can repeat at a constant duty cycle or a variable duty cycle, and states S1-S4, S1-S3 of each pulse P1, P2 may have the same or varying amplitudes and widths. Further, pulse signal 70 need not be a square wave as shown in FIG. 2. By way of non-limiting example, pulse signal 70 may be trapezoidal, triangular, gaussian, or other shape. Further yet, pulses P1, P2 can have multiple states S1, . . . , Sn of varying amplitude, duration, and shape. States S1, . . . , Sn may repeat within a fixed or variable period. Also shown in FIG. 2, RF signal 80 operates at a frequency that varies between states or within a state.

In a typical RF power delivery system, matching network (e.g., matching network 18a of FIG. 1) is adjusted to achieve maximum power delivery to load via tunable mechanical components. The maximum power delivery is indicative of a minimum reflected power. Because the response times of the electro-mechanical tuning elements in matching network are comparatively slow, adjustment of matching network may take a relatively extended period to complete the power adjustment. To improve impedance matching, the RF frequency output by power amplifier (e.g., power amplifier 14a of FIG. 1) may also be adjusted. Frequency-based tuning improves performance and provides responsiveness several orders of magnitude faster than adjustment of electro-mechanical components of matching network.

When employing frequency-based impedance matching, it is desirable to find an optimal frequency that provides minimum reflected power. The minimum reflected power may be indicated through a minimum magnitude of the measured complex reflection coefficient gamma, $|\Gamma|$. There are a number of existing methods for adjusting the RF frequency.

For example, automated frequency tuning is a standard approach for high-speed impedance matching. By adjusting the RF carrier frequency, the RF generator steers toward lower reflected power and compensates for transients in the load, even at pulse state change boundaries. Examples of automated frequency tuning methods include an extremum-seeking control (ECS) approach and a closed-form model based (such as a transfer function) approach. Examples of the ECS based approach for performing auto or automated frequency tuning can be found with reference to U.S. Pat. No. 10,741,363, assigned to the assignee of the present application and incorporated by reference in this application.

The ESC approach minimizes reflected power without requiring extensive knowledge of the process. The ESC approach implements a dynamic adjustment mechanism to auto tune the frequency along a direction of a gradient of a cost function without requiring an explicit model of the system or process. A cost function can be generally referred to as a functional equation that maps a set of points to a single scalar value. The scalar value that results from evaluation of a cost function can be referred to as a cost. For a frequency tuning application, this cost is sometimes associated with the magnitude of gamma squared or gamma mag squared ($|\Gamma|^2$) or an output response value such as delivered power. It is generally desirable to minimize or maximize the cost.

Figure 3A:
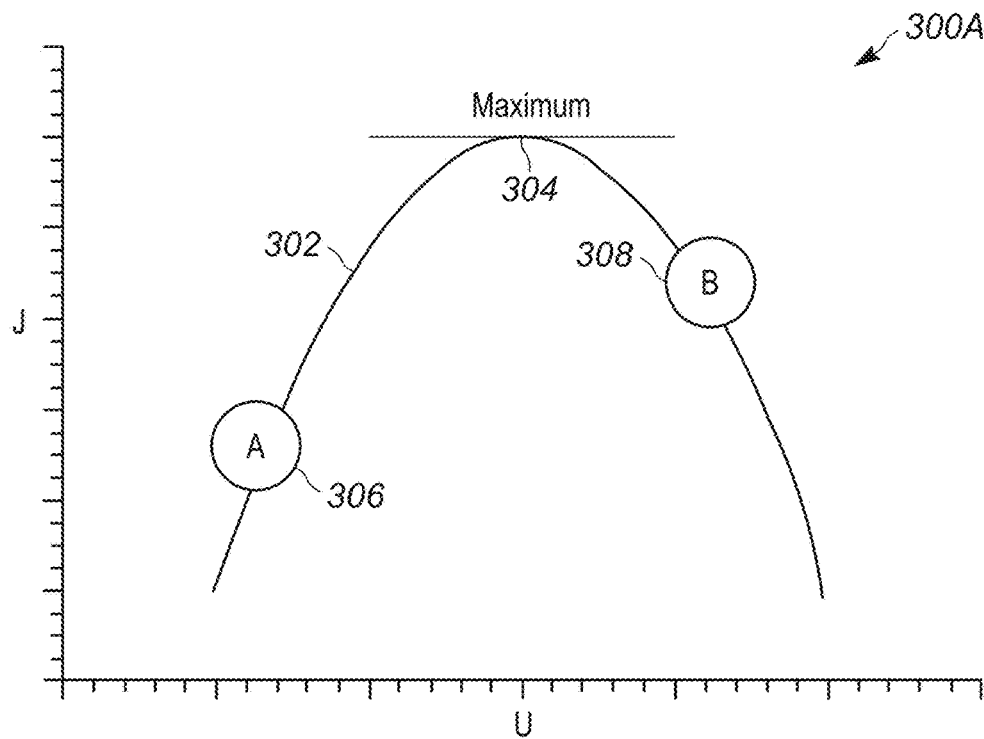
FIGS. 3A-B shows plots of a quadratic cost function as a function of a cost and an actuator frequency.

For example, FIG. 3A depicts plot 300A of a quadratic cost function 302 as a cost function J (or gamma mag squared ($|\Gamma|^2$) and an actuator frequency U. As shown, plot 300A includes a maximum 304 and positions 306, 308 along cost function 302, with each position 306, 308 being on different sides of maximum 304. Accordingly, all points to the left of maximum 304 have a positive slope (or gradient), and all points to the right of maximum 304 have a negative slope. If it is desirable to maximize cost J and actuator frequency is at position 306, actuator frequency may be increased thereby causing an increase in cost J or output response value. In other embodiments, if it is desirable to maximize cost J and actuator frequency is at position 308, actuator frequency may be decreased thereby causing an increase in cost J.

Figure 3B:
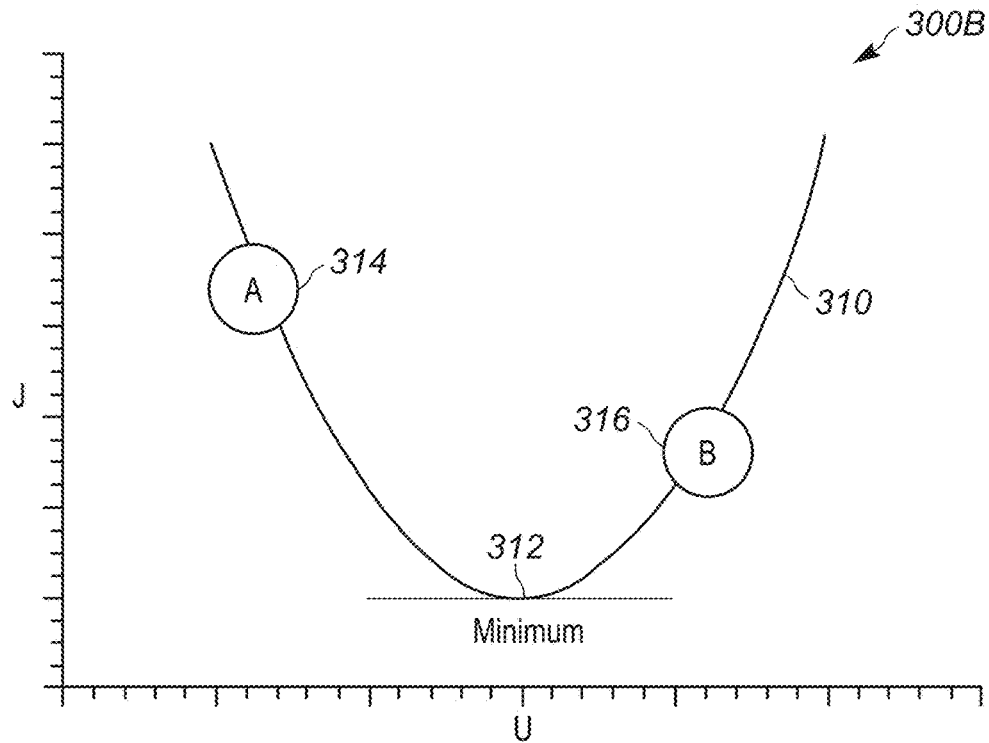

Similar relationships exist in connection with a quadratic cost function having a minimum. For example, FIG. 3B depicts plot 300B of a quadratic cost function 310 as a cost function J (or gamma mag squared ($|\Gamma|^2$) and an actuator frequency U. As shown, plot 300B includes a minimum 312 and positions 314, 316 along cost function 310, with each position 314, 316 being on different sides of minimum 312. As such, in this example, all points to the left of minimum 312 have a negative slope, and all points to the right of minimum 312 have a positive slope. If it is desirable to minimize cost J and actuator frequency is at position 314, actuator frequency may be increased thereby causing a decrease in cost J or output response value. In other embodiments, if it is desirable to minimize cost J and actuator frequency is at position 316, actuator frequency may be decreased thereby causing a decrease in cost J.

To maximize or minimize cost J in FIGS. 3A-B, it is desirable to understand the directionality of actuator frequency U required to move the cost function towards a minimum or maximum value. In a typical ESC approach, this may be accomplished by injecting a sinusoidal perturbation signal over multiple cycles on the actuator to probe the response of the system (e.g., the change in the cost function) to a changing actuator frequency. For example, based on the sinusoidal perturbation signal, the output response value (or cost) changes, with its magnitude and direction depending on where its current position is (e.g., positions 306, 308, 314, 316 of FIGS. 3A-B) relative to a minimum or maximum point (e.g., maximum 304, minimum 312). The output response values may be processed to estimate a local slope (or gradient) of the cost function (e.g., cost function 302, 310), which in turn indicates a direction of actuator frequency adjustment required to move towards the minimum or maximum point. Examples of the ESC approach employing a sinusoidal perturbation signal can be found with reference to U.S. Pat. No. 10,741,363.

While an ESC approach employing a sinusoidal perturbation signal is advantageous over other conventional automated frequency tuning methods such as transfer function methods, the subject inventors recognized that such an approach may be improved upon. For example, and as recognized by the inventors, a sinusoidal perturbation signal may cause, in steady-state conditions near an ideal tune point (the minimum or maximum cost function point), a sinusoidal pattern on the frequency actuator and also on a resulting measured gamma mag squared signal. Such movement in the load can also induce an unwanted variation in the forward and delivered power output from the generator. Additionally, a transient tuning time of a frequency controller may be limited by the injected sinusoidal perturbation signal. For instance, to accurately estimate the gradient, output response values are typically measured over multiple cycles of the perturbation signal. As such, the transient tune speed is limited by the frequency of the sinusoidal perturbation signal. Further, corruption of the gradient estimate by other signals in the system is possible if, for example, the frequency of the sinusoidal perturbation signal is near, at, etc. frequencies of the other signals. One such interfering signal may be, for example, from an "apparent" pulse frequency that moves around based on a pulsing setup, and sometimes occurs when frequency tuners are statified (e.g., each tuner receives data relative to one state of a pulse or pulses).

Uniquely, the ESC approaches disclosed herein enables the estimation of a slope of a cost function (e.g., cost function 302, 310 of FIGS. 3A-B) based on historic frequency values of a frequency actuator/controller and corresponding output response values. As such, the need for a sinusoidal perturbation signal is eliminated when using ESC approaches for frequency tuning-based impedance matching. As a result, the transient tuning time may be improved, sinusoidal variation in the actuator and the output response may be reduced (and sometimes eliminated), and the sensitivity of the tuner to other frequencies in the system (e.g., harmonics, aliases, pulse related frequency artifacts, etc.) may be reduced (and sometimes removed) as compared to ESC approaches implementing an injected sinusoidal perturbation signal.

Figure 4:
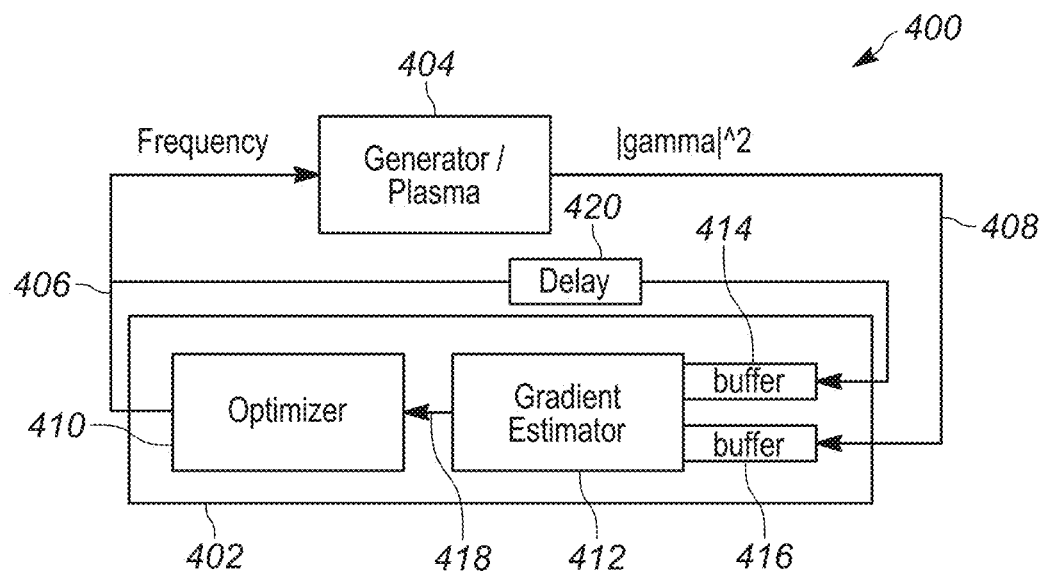
FIG. 4 shows a block diagram of a RF power delivery system implementing an extremum-seeking control (ESC) based approach arranged in accordance with the principles of the present disclosure.

FIG. 4 depicts one example of a power delivery system 400 implementing an ESC based approach, in which an actuator frequency is adjusted based on historic frequency values and corresponding output response values. Power delivery system 400 includes a frequency controller 402 and a process dynamics block 404 including, for example, at least one RF generator, at least one matching network, and a load such as a plasma chamber. Frequency controller 402 includes a frequency optimizer module or an extremum-seeking frequency module or controller 410 and a gradient estimator module 412. Frequency controller 402 generates and outputs a frequency actuator signal having a frequency 406 to block 404 and receives a feedback signal having output response (e.g., gamma mag squared) 408 from block 404.

In various embodiments, the output response 408 from process dynamics block 404 represents the system 400 response to the frequency 406. For example, the output response 408 may be an output measurement (or a derivation thereof) associated with a load variable (e.g., a post-match power measurement), an output measurement (or a derivation thereof) associated with the RF generator, etc.

In the example of FIG. 4, frequency 406 is adjusted based on historic frequency values and corresponding output response values. For example, a rolling buffer of the historical data of both the frequency actuator output and the corresponding output response may be maintained. As such, in various embodiments, frequency controller 402 may include buffer 414 for maintaining values of frequency 406 and buffer 416 for maintaining corresponding values of output response 408. In various embodiments, buffers 414, 416 may be portions of computer-readable medium such as memory hardware as used herein. Although frequency controller 402 is shown as including buffers 414, 416, it should be appreciated that buffers 414, 416 may be external to frequency controller 402.

In various embodiments, power delivery system 400 may include a configurable delay module 420 between frequency controller 402 and buffer 414. In such embodiments, the frequency actuator signal with frequency 406 passes through configurable delay module 420 before reaching buffer 414. In this manner, configurable delay module 420 may apply an appropriate delay (if necessary) to frequency actuator signal to account for a possible delay associated with process dynamics block 404 (e.g., an actuator in block 404) and its output response. In various embodiments, the delay may be zero. In other words, frequency 406 may pass through configurable delay module 420 without a delay being applied. In other embodiments, a delay may be set to a defined value. In such embodiments, the set delay may be experimentally or analytically determined based on a known or determined delay associated with process dynamics block 404 and its output response.

Gradient estimator module 412 retrieves values of frequency 406 and output response 408 from buffers 414, 416, and then estimates a local gradient 418 of a cost function (e.g., cost function 302, 310 of FIGS. 3A-B) based on the values. For example, and as further explained herein, the buffered information can be used to fit a linear model, effectively calculating an estimate of the local gradient. Gradient estimator module 412 outputs a gradient signal including the estimated gradient 418 to frequency optimizer module 410, where frequency optimizer module 410 determines a new frequency 406 of the frequency actuator signal based on gradient 418 that moves output response (or cost) toward a minimum or maximum point. As such, with the ECS approach of FIG. 4, information along the natural tune trajectory is leveraged to estimate the local gradient without requiring the injection of a sinusoidal perturbation signal to the system.

Figure 5A:
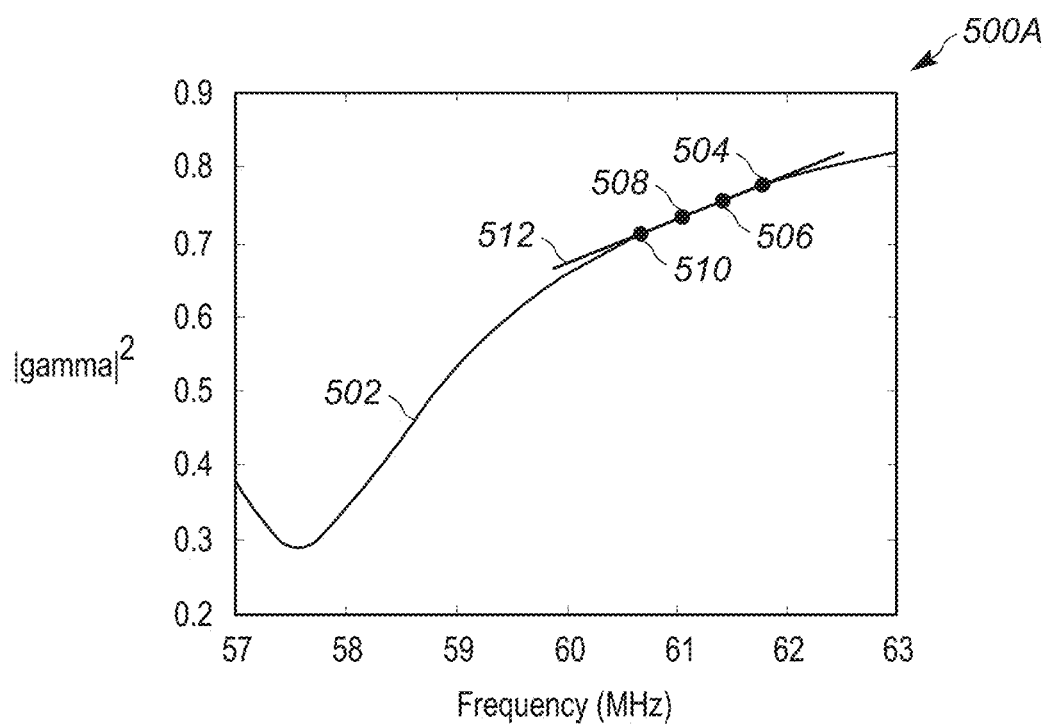
FIGS. 5A-B show plots of a quadratic cost function with a local estimated gradient arranged in accordance with the principles of the present disclosure.
Figure 5B:
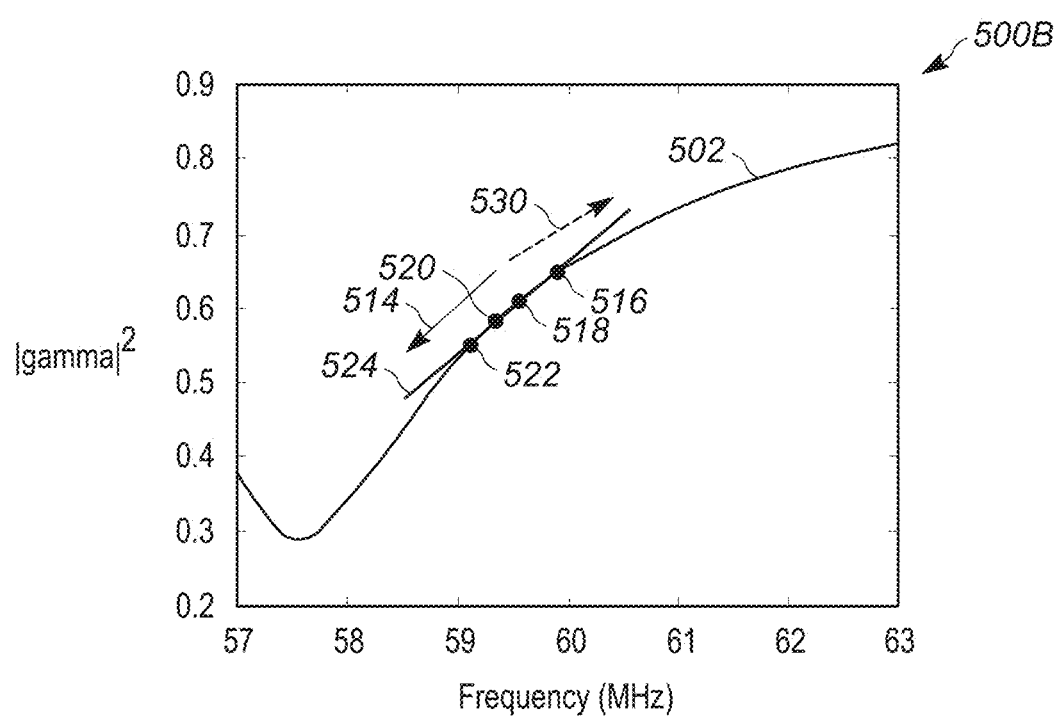

FIGS. 5A-B depict plots 500A, 500B of a quadratic cost function 502 as a function of output response 408 (gamma mag squared) and frequency 406 (actuator frequency) of FIG. 4. In FIGS. 5A-B, function 502 may be represented by a frequency response curve.

In FIG. 5A, points 504, 506, 508, 510 along function 502 are determined based on corresponding values of frequency 406 and output response 408 in buffers 414, 416. For example, point 504 (e.g., a first point) represents a frequency value of about 61.75 MHz and a corresponding output response of about 0.775, point 506 (e.g., a second point) represents a frequency value of about 61.5 MHz and a corresponding output response of about 0.75, point 508 (e.g., a third point) represents a frequency value of about 61 MHz and a corresponding output response of about 0.725, and point 510 (e.g., a fourth point) represents a frequency value of about 60.75 MHz and a corresponding output response of about 0.7. Line 512 is fit in accordance with points 504, 506, 508, 510, and represents a local gradient of function 502.

In the example of FIGS. 5A-B, it is desired to move output response or gamma mag squared toward a minimum point. As such, after the local gradient is estimated, frequency optimizer module 410 may adjust the frequency in steps opposite the gradient, towards a minimum value of gamma mag squared (represented by arrow 514), as shown in FIG. 5B.

In FIG. 5B, points 516, 518, 520, 522 along function 502 are determined based on new values of frequency 406 and output response 408 in buffers 414, 416, collected as the frequency and output response change. A new local gradient of function 502 along points 516, 518, 520, 522 can be determined (again) based on line 524 fit in accordance with points 516, 518, 520, 522.

In various embodiments, frequency optimizer module 410 may adjust the frequency in a wrong direction such as away from minimum value of gamma mag squared, as represented by dashed arrow 530. This may occur for various reasons as further explained herein. In such examples, frequency controller 402 quickly adjusts and corrects the direction by estimating a local gradient based on newly collected values of frequency 406 and output response 408 along the path indicated by dashed arrow 530 and adjusting the frequency 406 accordingly.

Figure 6:
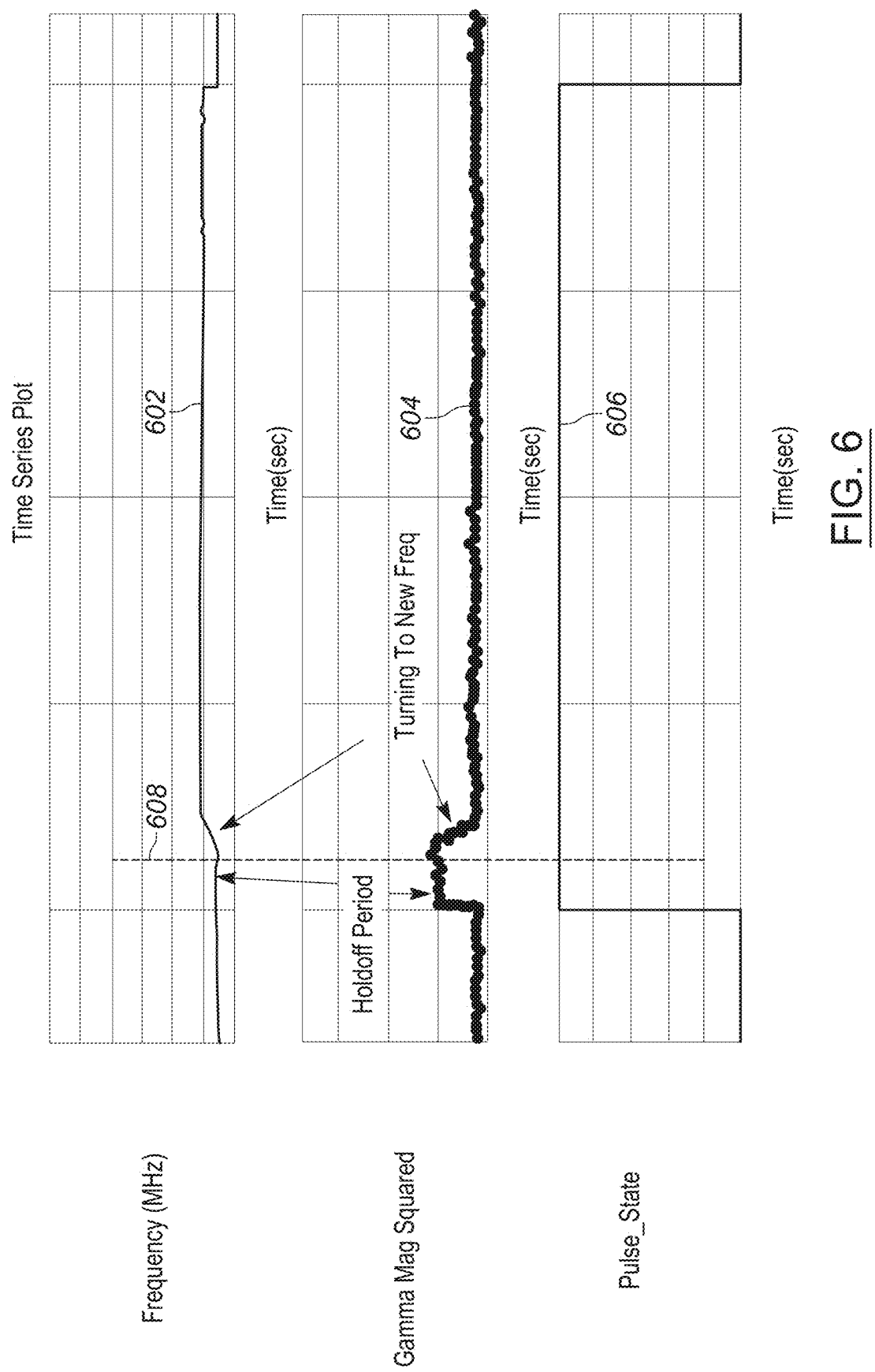
FIG. 6 shows a plot of various waveforms associated with an ESC based approach arranged in accordance with the principles of the present disclosure.

In other embodiments, a disturbance may trigger frequency optimizer module 410 to adjust the frequency in a wrong direction and/or otherwise cause frequency to move in a wrong direction such as away from minimum value of gamma mag squared. For example, FIG. 6 depicts various waveforms in accordance with such a scenario. Specifically, FIG. 6 depicts waveforms 602, 604, 606 representing the frequency 406 of a frequency actuator signal generated by frequency controller 402, the output response (gamma mag squared) 408 of the system based on the frequency, and a pulse, respectively.

As shown, waveforms 602, 604 are optimal prior to the state transition. In other words, frequency optimizer module 410 has determined the optimal frequency of frequency actuator signal and moved the output response to a minimal point. The state transition functions as a disturbance in the system, causing output response waveform 604 to move away from its optimal positions. At this time, frequency waveform 602 is unchanged because the system is in a defined holdoff period (e.g., a period of time in which a frequency controller is held idle at a state transition of the pulse). After the holdoff period, frequency waveform 602 begins to move causing output response waveform 604 to initially move in the wrong direction (e.g., away from a minimal point). However, as can be seen in FIG. 6, only after a few iterations into the pulse, frequency controller 402 is able to again find the optimal frequency of frequency actuator signal to move the output response to a minimal point.

In various embodiments, and with reference to FIG. 4, buffers 414, 416 of FIG. 4 and/or other buffers disclosed herein may be implemented in various manners. For example, buffers 414, 416 of FIG. 4 may be implemented for an entire pulse (e.g., pulse P1, pulse P2 of FIG. 2), a state of a pulse (e.g., state S1 of pulse P1 of FIG. 2), each state of multiple pulses (e.g., state S1 of each pulse P1, P2 of FIG. 2), etc.

For instance, if a non-statified approach is desired, buffers 414, 416 may be implemented for an entire pulse including multiple states. In other words, buffering of frequency values 406 and output response values 408 is by each pulse. This may be desirable in scenarios where the pulse includes a large number of states (e.g., more than five, etc.).

In other embodiments, a statified approach may be desired. In such examples, buffers 414, 416 may be implemented for each state of a pulse or multiple pulses. In other words, buffering of frequency values 406 and output response values 408 is by each state. As such, buffers 414, 416 may store data from only one state (at a time). This may be desirable in scenarios where the pulse include a smaller number of states (e.g., five or less, etc.).

In various embodiments, one or more other sets of buffers may be implemented. For example, buffers 414, 416 may be implemented for one state (S1) of a pulse or multiple pulses and another set of buffers may be implemented for another state (S2) of the pulse or the multiple pulses. Further, if the pulse or pulses include another state (S3), another set of buffers may be implemented for that state. Additionally, in some embodiments, buffers 414, 416 and/or other sets of buffers may be implemented for other pulse conditions. For instance, buffers 414, 416 may be used for periods within a state of a pulse and another set of buffers may be used for transition periods between states.

In various embodiments, buffers 414, 416 and/or other buffers disclosed herein may be sized as desired. For example, each buffer may store a fixed (e.g., a defined) number of samples or a variable/dynamic number of samples between a range of 5 and 20. In some embodiments, each buffer may store 5 data samples, in data samples, 15 data samples, 20 data samples, and/or another suitable number therebetween.

The fixed number of samples stored in each buffer may be selected as desired. For example, the selection may pose a trade off between parameters such as noise tolerance and agility of the buffers. For instance, if the buffers store a large number (e.g., 20) of samples, a larger amount of data is available for slope estimations and noise implications becomes less of a factor due to this larger amount of data. However, with the larger number of samples, the buffers become less agile, as it takes longer for each buffer to adjust to changing operating conditions (e.g., an actual gradient of cost function 502). Conversely, if the buffers store a smaller number (e.g., 5) of samples, the buffers become more agile, as it takes less time for each buffer to adjust to new operating conditions. However, in such scenarios, a smaller amount of data is available for slope estimations and noise implications become more of a factor.

Additionally, the manner in which the buffers are implemented may be a factor in setting the fixed number of samples stored in each buffer. For example, if buffers 414, 416 are used for periods within a state of a pulse, longer states, an entire pulse, etc., it may be desirable for the buffers to store a large number (e.g., 20) of samples. This would provide robust data for slope estimations that is less susceptible to noise. If, however, buffers 414, 416 are used for transition periods between states, shorter states, etc., it may be desirable for the buffers to store a smaller number (e.g., 5) of samples. This would provide a more agile buffer able to quickly adjust to changing operating conditions during such rapid transition periods.

In various embodiments, buffers 414, 416 and/or other buffers herein are purged of data. In other words, some or all values of frequency 406 and output response 408 in buffers 414, 416 may be erased, moved to another storage location, etc. For instance, buffers 414, 416 can be implemented as a FIFO (first in first out) where one sample (e.g., the oldest sample) is removed for every new sample added. In other embodiments, the entire set of samples (or a portion thereof) may be moved to a storage location, and then recalled at a later time.

The purging of values may be based on various parameters. For example, the buffers 414, 416 may purge their stored values in response to the number of stored values reaching a defined number (e.g., 5 samples, 10 samples, 15 samples, 20 samples, etc.). In other examples, the buffers 414, 416 may purge their stored values according to pulse conditions such as, for example, when a new state begins, when a new pulse begins, during a transition, during a state, etc.

For instance, in one example, buffers 414, 416 are implemented for state S1 of a two-state pulse or multiple two-state pulses and another set of buffers are implemented for state S2 of the pulse or the pulses. In this example, buffers 414, 416 may be purged during state S2 and the other buffers may be purged during state Si. In another example, buffers 414, 416 may be implemented for both state S1 and state S2 of a two-state pulse train. In such examples, values associated with state Si of a first pulse may be purged (e.g., erased, moved to a storage location, etc.) before buffers 414, 416 store new values associated with state S2 of the first pulse. Then, upon state Si of the next pulse, the values associated with state S2 of the first pulse may be purged and the values associated with state S1 of the first pulse may be recalled into buffers 414, 416 if those values were moved.

In various embodiments, gradient estimator module 412 may estimate the local gradient in various different manners. For example, gradient estimator module 412 may estimate the gradient based on various summations of stored frequency 406 and/or output response 408 values. In such examples, the gradient may be estimated in accordance with Equations (1)-(6):

$$Sx = \sum_{i=1}^{N} x_i \quad (1)$$

$$Sy = \sum_{i=1}^{N} y_i \quad (2)$$

$$Sxx = \sum_{i=1}^{N} x_i^2 \quad (3)$$

$$Sxy = \sum_{i=1}^{N} x_i * y_i \quad (4)$$

$$\Delta = N * Sxx - Sx^2 \quad (5)$$

$$M = \frac{N * Sxy - Sx * Sy}{\Delta} \quad (6)$$

where:

$x_i$ represents a stored frequency value, $y_i$ represents a stored output response value, N is the total number of samples (e.g., 5, 20, etc.), and M is the estimated gradient (or slope).

In other embodiments, gradient estimator module 412 may estimate the gradient based on minimum and maximum output response values stored in buffer 416 and corresponding frequency values stored in buffer 414. This may serve to reduce the number of multipliers and accumulators required to compute the estimated gradient as compared to, for example, Equations (1)-(6). Such a reduction may be desirable (and sometimes necessary) in FPGA based applications. In such examples, the estimated gradient (or slope) M may be estimated in accordance with Equation (7):

$$M = \frac{\max(y) - \min(y)}{X_{\max(y)} - X_{\min(y)}} \quad (7)$$

where:

max(y) is the largest (or maximum) output response value stored in buffer 416, min(y) is the smallest (or minimum) output response value stored in buffer 416, $X_{\max(y)}$ is the frequency value stored in buffer 414 corresponding to max(y), and $X_{\min(y)}$ is the frequency value stored in buffer 414 corresponding to min(y).

In such examples, actual minimum and maximum output response values in buffer 416 may need to be selected from the other stored values or otherwise computed.

In various embodiments, gradient estimator module 412 may estimate or calculate only a sign of local gradient rather than its amplitude. In other words, gradient estimator module 412 may estimate whether the stored frequency 406 values and output response 406 values are indicative of a positive slope or a negative slope along the cost function. In such examples, frequency optimizer module 410 may generate and output a frequency actuator signal having a new frequency 406 based on the sign of local gradient, to thereby move output response (or cost) toward a minimum or maximum point.

In various embodiments, the buffered data may be sub-sampled and/or filtered before gradient estimator module 412 estimates the local gradient. For instance, gradient estimator module 412 and/or frequency controller 402 may include one or more boxcar and/or median filters for such implementations.

In various embodiments, buffers 414, 416 and/or other buffers herein may be empty. This may occur, for example, at startup of the system 400 such as a cold start where no power is delivered to a load. In other examples, buffers may be empty of data after a purge of data, when defined pulse conditions change (e.g., a recipe change causing, for example, pulse states to change, pulse periods to change, duty cycles to change, pulse replication rates to change, etc.), transitioning from a continuous wave mode to a pulse mode, etc. If the buffers 414, 416 and/or other buffers herein are empty, gradient estimator module 412 is unable to estimate a gradient based on stored values. Multiple options are available to address this scenario.

For example, according to various embodiments, gradient estimator module 412 can estimate the gradient based on one or more defined operating parameters. For instance, gradient estimator module 412 can assume an initial condition for the gradient on first movement of the frequency and corresponding output response. Then as buffers 414, 416 are filled with new frequency 406 values and output response 408 values, gradient estimator module 412 can estimate the gradient with available operating parameters such as a preset starting frequency, an initial gamma mag squared measurement, particular pulse conditions, etc. Any inaccuracy in this initial assumption will be quickly overcome as the buffered tune trajectory data can provide accurate slope measurements, as explained herein. In various embodiments, a lookup table based on the preset starting frequency, the initial gamma mag squared measurement, particular pulse conditions, or other factors to select the initial starting slope may be employed.

In other embodiments, a series of perturbations may be injected around the starting frequency to prefill buffers 414,

416 with data. The perturbations may include, for example, a ramp signal, a pseudo-random binary sequence, white noise, etc. Gradient estimator module 412 can initially estimate the gradient based on the perturbations, and then quickly proceed towards the optimal tune frequency, as explained herein.

In various embodiments, it may be difficult for frequency controller 402 to frequency tune when it reaches or nears the optimal tune point (e.g., when the output response reaches or nears a minimum or maximum point). For example, as the optimal tune point or target frequency becomes closer, the slope of the response curve or cost function approaches zero. As a result, the actuator frequency will move less and less, which can cause issues with the estimate of the slope using the buffered data. Multiple options are available to address this scenario.

For example, according to various embodiments, gradient estimator module 412 can force or otherwise set the estimated gradient to zero. This effectively stops frequency optimizer module 410 from moving the actuator. The estimated gradient may be set to zero when a magnitude of the estimated gradient falls below or meets a defined threshold value. In various embodiments, a value of the threshold may be selected, determined, etc. depending on, for example, the RF generator and operating conditions of the system 400, etc. For instance, the threshold value may be a value of 0.015 gamma mag squared per kHz (e.g., a slope of 1.5e-5), 0.015 gamma mag squared per MHz (e.g., a slope of 1.5e-8), or another suitable value based on the RF generator and operating conditions.

Frequency optimizer module 410 may be restarted if a disturbance occurs to cause output response 408 to move away from its optimal position. For example, if a change in output response values (gamma mag squared values) is above a defined threshold value from where it was at this stopping condition, frequency optimizer module 410 may be restarted. Examples of a threshold value include 1%, 5%, 10% or another suitable percentage relative to the output response value when the actuator stopped (e.g., a percent difference from that stopping condition). In such scenarios, some form of initialization strategy may be required to seed the first movements from the off condition. For example, the last slope value estimated before the estimated gradient was set to zero may be used. Alternatively, one of the example options explained above to fill empty buffers may be employed. In yet other embodiments, a separate, defined restart slope other than what is used at startup (e.g., a cold start).

In other embodiments, gradient estimator module 412 can impose a lower limit on the magnitude of an estimated gradient. In other words, gradient estimator module 412 may clamp the estimated gradient to a defined clamp threshold value in response to the estimated gradient reaching or falling below that value. For instance, the clamp threshold value may be 0.015 gamma mag squared per kHz (e.g., a slope of 1.5e-5), 0.015 gamma mag squared per MHz (e.g., a slope of 1.5e-8), or another suitable value based on the RF generator and operating conditions. Due to the clamping of the estimated gradient, frequency controller 402 will effectively "dither" around a target frequency (corresponding to a minimum or maximum point of the output response). However, such dithering may not be noticeable (or minimally noticed) in content of the output response (gamma mag squared) 408 values and frequency 406 values if the clamp threshold value is sufficiently small.

In various embodiments, the clamp threshold value may be based on various operating conditions. For example, the clamp threshold value may be based on a power level, a pulsing configuration, an operating frequency, etc. This may, for example, enable the tailoring the amount of acceptable dither in the actuator and output based on one or more operating conditions rather than having a single value.

Figure 7:
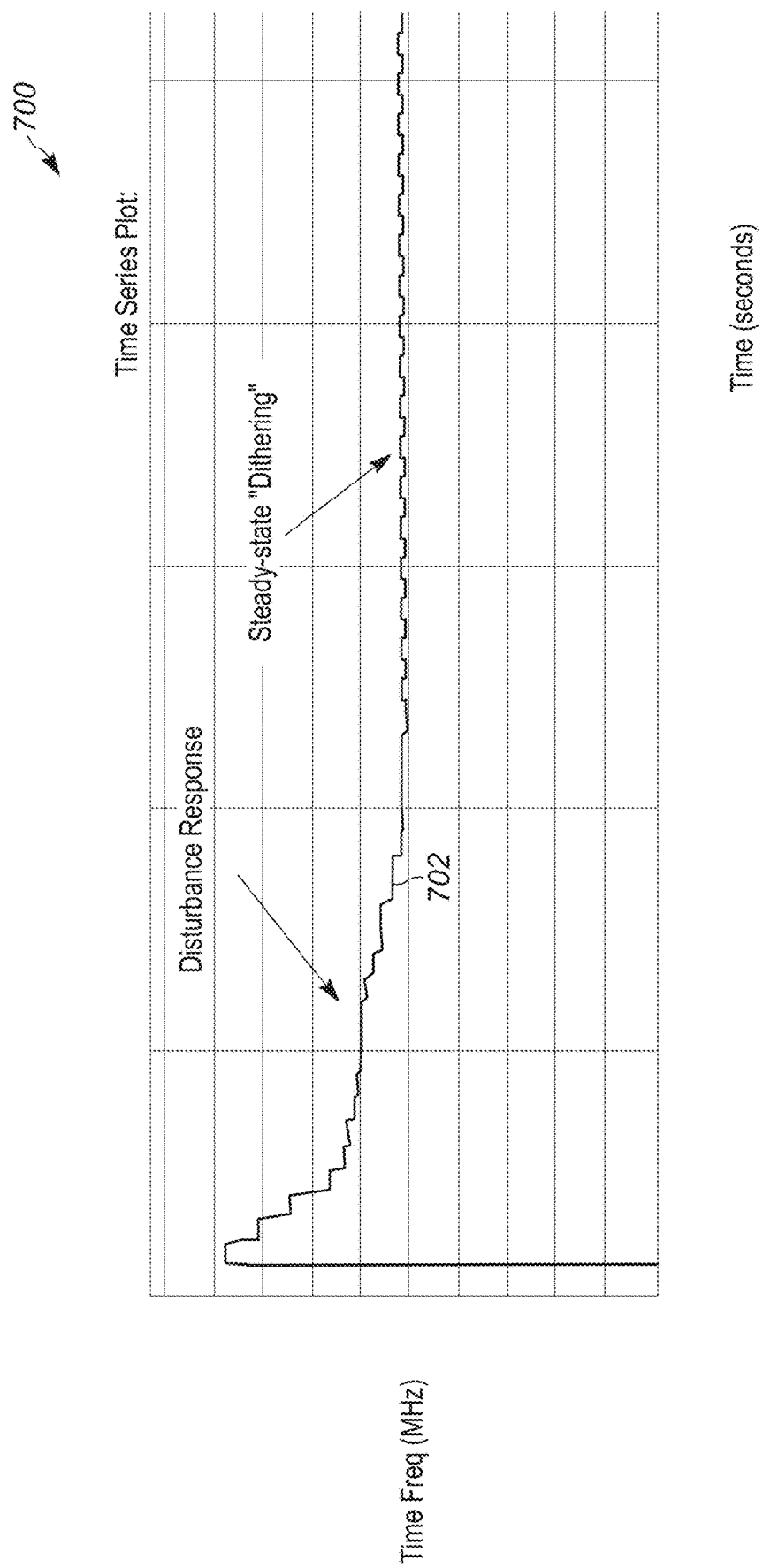
FIG. 7 shows a plot of a frequency waveform associated with a ESC based approach arranged in accordance with the principles of the present disclosure.

FIG. 7 depicts a plot 700 of a frequency waveform 702, where an estimated gradient is clamped to a defined threshold value (e.g., a slope of 1.5e-8) as explained above. As shown, the tune frequency experiences a minimal steady state dither around a target frequency.

In other embodiments, a random signal such as a pseudo-random binary sequence, white noise, etc. may be added the output of frequency controller 402 when it reaches or nears the optimal tune point (e.g., when the output response reaches or nears a minimum or maximum point). This causes frequency 406 to dither near a target frequency, and ensures the estimated gradient does not become degenerate near the target frequency. Although this approach requires a persistent signal injected into frequency 406, the signal is random and not sinusoidal. Therefore, the random signal would provide much smaller impact to the steady-state performance (e.g., less noticeable) as compared to a monotone sinusoidal signal.

Figure 8:
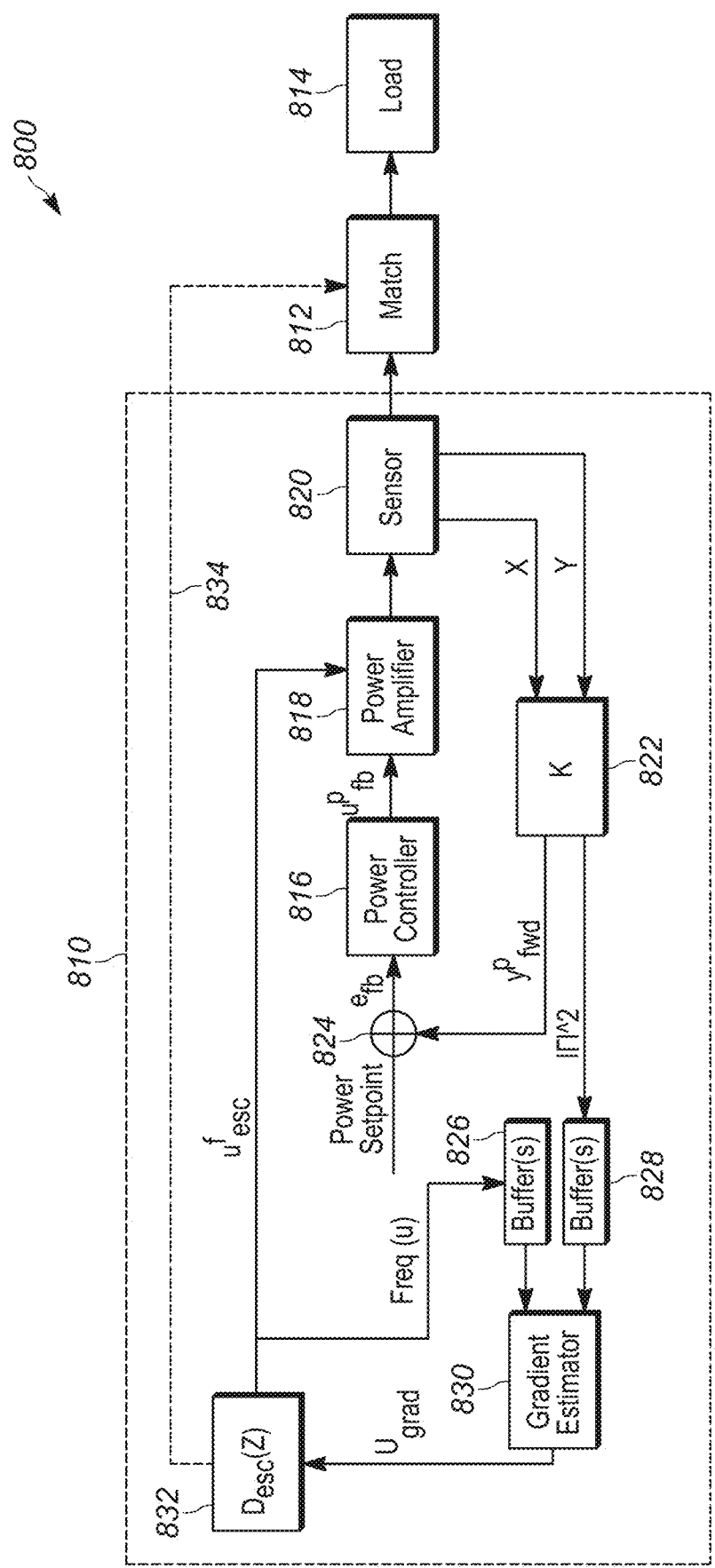
FIG. 8 shows a block diagram of a RF power delivery system implementing an ESC based approach arranged in accordance with the principles of the present disclosure.

FIG. 8 depicts one example of a power delivery system 800 including RF generator 810 implementing the ESC based approach as described herein. As shown, power delivery system 810 provides output to match network 812, which in turn provides output to load 814, such as non-linear load or plasma chamber.

RF generator 810 includes power controller 816, power amplifier 818, and sensor 820. Sensor 820 may be implemented as one of a voltage/current sensor (VI sensor) or a directional coupler, as described above. Power controller 816 outputs an actuation signal $u_{fb}^P$ input to power amplifier 818. The u $u_{fb}^P$ signal represents a power control signal responsive to a feedback signal. Power amplifier 818 generates an output RF signal to sensor 820 as commanded by $u_{fb}^P$. Sensor 820 outputs the RF signal to match network 812 for application to load 814. Sensor 820 outputs feedback signals X, Y to block 822. In various embodiments, block 822 can be a scaling or calibration module that scales X and Y to output predetermined electrical parameters. Block 822 outputs a forward power value $y_{fwd}^P$ to summer 824. Summer 824 also receives a power setpoint input, and determines a difference (e.g., error $e_{fb}$) between the power setpoint input and the forward power value $y_{fwd}^P$. Error $e_{fb}$ is input to power controller 816, and used to determine a desired adjustment to signal $u_{fb}^P$. Block 822 also outputs gamma mag squared ($|\Gamma|^2$) (e.g., an output response). In various embodiments, block 822 may instead output gamma mag (e.g., the magnitude of the reflection coefficient $|\Gamma|$) and another module such as a squaring module may receive gamma mag and output gamma mag squared ($|\Gamma|^2$).

As shown in FIG. 8, RF generator 810 further includes one or more buffers 826, one or more buffers 828, gradient estimator 830 and control block or controller 832. Buffers 826, 828, gradient estimator 830, and control block 832 of FIG. 8 may be similar to and function in a similar manner as buffers 414, 416, gradient estimator module 412, and controller 410 of FIG. 4. Specifically, in FIG. 8, control block 832 (e.g., an integrator $D_{esc}(z)$) generates a frequency control or frequency actuation signal $u_{esc}^f$ input to power amplifier 818. Gradient estimator 830 estimates a local gradient of a cost function and generates a gradient signal $u_{grad}$ input to control block 832. Buffer 826 receives and stores frequency (u) values of frequency control signal $u_{esc}{}^f$ and buffer 828 receives and stores output response (gamma mag squared) values.

During operation, control block 832 generates a frequency control signal $u_{esc}{}^f$ based on the estimated local gradient in gradient signal $u_{grad}$ provided by gradient estimator 830. For example, the local gradient (or slope) of the cost function (e.g., cost function 302, 310 of FIGS. 3A-B, cost function 502 of FIGS. 5A-B, etc.) may indicate a direction of actuator frequency adjustment required to move towards a desired minimum or maximum point of the cost function. As such, based on the estimated local gradient, control block 832 adjusts a frequency of control signal $u_{esc}{}^f$ to move the output response towards a desired minimum or maximum point. Buffers 826, 828 then receive and store the new frequency (u) value of control signal $u_{esc}{}^f$ and the systems response (in the form of gamma mag squared) to the new frequency. Buffers 826, 828 may receive and store each new frequency (u) value of control signal $u_{esc}{}^f$ and each response (in the form of gamma mag squared) to that frequency.

Gradient estimator 830 estimates a local gradient of the cost function based on stored frequency (u) values and output response (gamma mag squared) values in buffers 826, 828. This estimation may be calculated in any suitable manner, such as by any one of the example methods disclosed herein.

Control signal $u_{esc}{}^f$ may be a complete frequency control signal (center frequency and AFT offset) or only an automatic frequency tuning (AFT) offset from the center frequency. In various non-limiting embodiments, if the center frequency of the system is 13.56 MHz, signal $u_{esc}{}^f$ may represent an offset from 13.56 MHz to enable automatic frequency tuning or may be a desired output frequency, 13.58 MHz, for example.

In various other embodiments, a control signal 834 may be output to match network 812. In such examples, control signal 834 can control an impedance tuning actuator, such as a reactive component embodied as a capacitor or inductor to vary a reactance of match network 812. In various embodiments, control block 832 may output control signal 834, as shown in FIG. 8. In other examples, the control signal may be output from another suitable control module in RF generator 810, from an external control module, etc.

Buffers 826, 828 may be implemented in any suitable manner, including any one of the examples provided herein. For example, each buffer 826, 828 may store a fixed (e.g., a defined) number of samples as explained above. Further, buffers 826, 828 may be implemented for an entire pulse (e.g., pulse P1, pulse P2 of FIG. 2), a state of a pulse (e.g., state S1 of pulse P1 of FIG. 2), each state of multiple pulses (e.g., state S1 of each pulse P1, P2 of FIG. 2), etc. In various embodiments, additional buffers may be implemented as explained above.

Additionally, in some embodiments, other parameters may be stored in buffers 826, 828 and/or other buffers associated with RF generator 810. For example, data from match network 812 may be received and stored in a buffer. Such data may include, for example, values of an impedance tuning actuator associated with match network 812. In such examples, control block 832 may not adjust a frequency of control signal $u_{esc}{}^f$ if it is determined that match network 812 can effectively make adjustments to improve impedance matching. If not, control block 832 may proceed to adjust a frequency of control signal $u_{esc}{}^f$ as explained herein.

In various embodiments, the output response may be moved towards a desired minimum or maximum point based on different gradients. For example, gradient estimator 830 estimates a local gradient based on frequency values of control signal $u_{esc}{}^f$ and corresponding output response values as explained herein. Additionally, gradient estimator 830 or another suitable control module in or external to RF generator 810 may estimate another gradient based on impedance tuning actuator values (e.g., positions of reactive components, varying reactive component setpoints, etc.) and corresponding output response values. Then, control block 832 (and/or another suitable control module) may receive both estimated gradients and determine which of the gradients is steepest (or largest). If the gradient based on frequency values of control signal $u_{esc}{}^f$ is larger, control block 832 may rely on that gradient to adjust the frequency of control signal $u_{esc}{}^f$ as explained herein. If, however, the gradient based on impedance tuning actuator values is larger, control block 832 may rely on that gradient to adjust control signal 834 (provided to matching network 812). By relying on the largest gradient, the output response may be moved towards a desired minimum or maximum point more quickly.

According to various embodiments, various portions of RF generator 810 can be considered to cooperate to define a frequency controller such as an extremum-seeking frequency controller. For example, in various embodiments, the frequency controller may include all or parts of control block 832. In other embodiments, the frequency controller may include, for example, all or parts of control block 832, gradient estimator 830, buffers 826, 828, etc. Additionally, according to various embodiments, various portions or all control elements of FIG. 8 can be implemented with a controller such as controller 20a, 20b, 20' of FIG. 1. For example, in FIG. 8, portions or all of power controller 816, control block 822, control block 832, buffers 826, 828, and/or gradient estimator 830 may implemented as controller 20a, 20b, 20' of FIG. 1.

Figure 9:
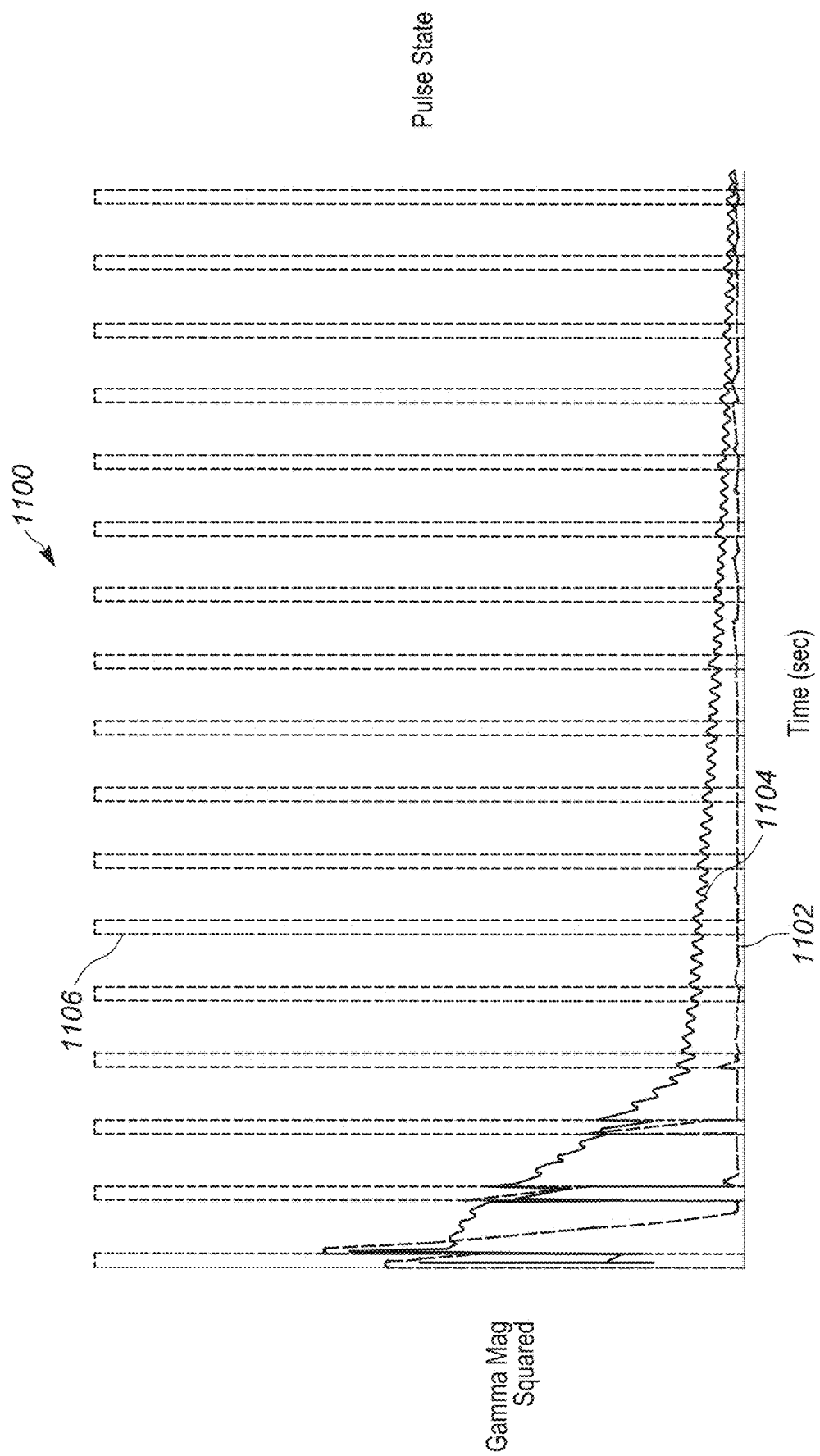
FIG. 9 shows a plot of an ESC based approach arranged in accordance with the principles of the present disclosure compared to a typical ESC based approach.

FIG. 9 depicts a plot 1100 comparing the output responses for two different ESC approaches over time. Specifically, plot 1100 includes an output response (gamma mag squared) 1102 using an ESC approach disclosed herein (e.g., estimating a local gradient based on previous frequency values and output response values), an output response 1104 using a typical ESC approach (e.g., estimating a local gradient based on a sinusoidal perturbation signal), and a pulse train 1106. As shown, pulse train 1106 consists of a two-state pulse with each first state S1 (the shorter state) having a duty cycle of about 10-20% and each second state S2 (the longer state) having a duty cycle of about 80-90%.

As shown in FIG. 9, output response 1102 has several advantages over output response 1104. For example, the time in which output response 1102 reaches or converges to an optimal value (e.g., a minimal point) is much shorter than compared to output response 1104. Specifically, output response 1102 reaches its optimal value for state S2 at about 1 pulse and for state S1 at about 3 pulses. Output response 1102 converges faster to its optimal value in state S2 as compared to state S1 because, for example, more data (e.g., more frequency and output response values) is collected during the wider state S2. This allows for more opportunities to make corrections with respect to collected data. In contrast, output response 1104 reaches an optimal value for both states S1, S2 at about 15 pulses.

Additionally, output response 1102 experiences less dither (e.g., wiggle or ripple) at its optimal value than output response 1104. For example, output response 1104 experiences more dither than output response 1102, due to the injected sinusoidal perturbation signal used in the typical ESC approach. The ESC approach used to obtain output response 1102 does not include this sinusoidal perturbation signal.

In various embodiments, the systems and methods herein may implement various control processes after estimating the gradient with, for example, gradient estimator module 412 of FIG. 4, estimator controller 830 of FIG. 8, etc. For example, after estimating the gradient, the systems and methods herein may implement any one of the control processes/systems described in U.S. Pat. No. 10,741,363 with respect FIGS. 18-22.

Figure 10:
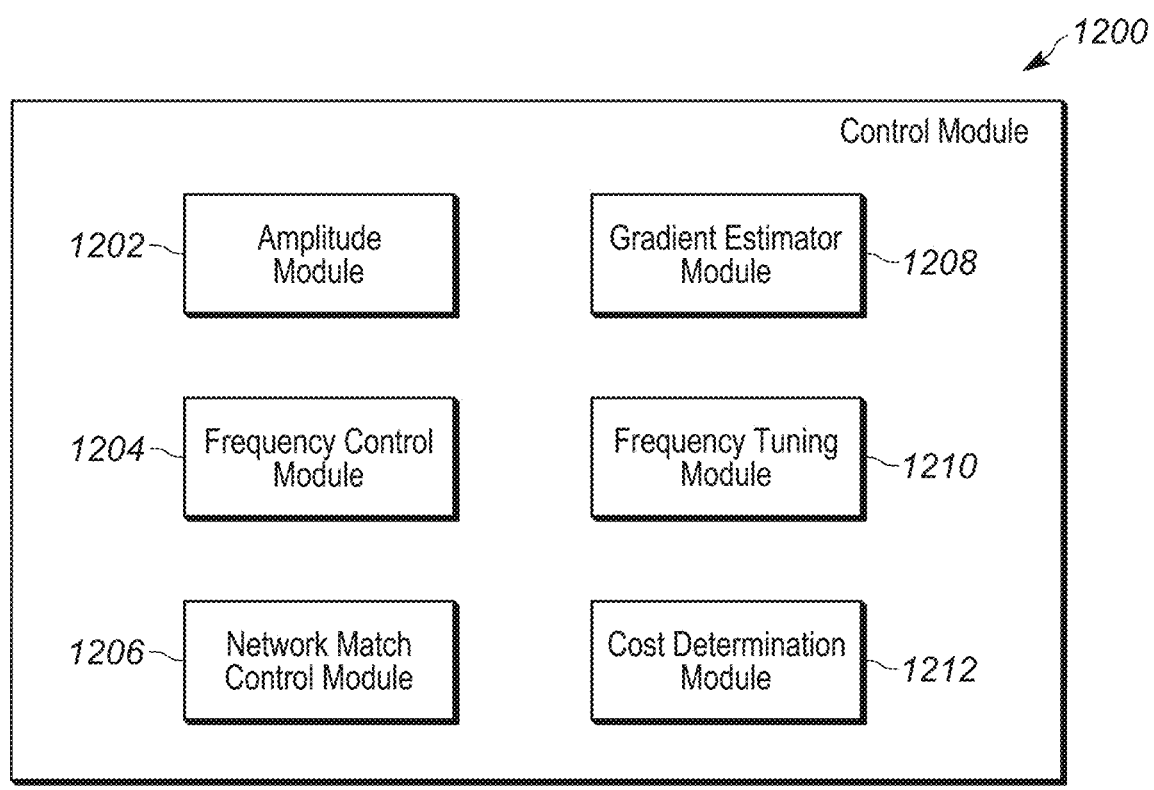
FIG. 10 shows a functional block diagram of an example control module arranged in accordance with various configurations.

FIG. 10 shows a control module 1200. Control module 1200 incorporates various components of FIGS. 1, 4 and 8. Control module 1200 may include amplitude control module 1202, frequency control module 1204, match network control module 1206, gradient estimator module 1208, frequency tuning module 1210, and cost determination module 1212. In various embodiments, control module 1200 includes one or a plurality of processors that execute code associated with the modules 1202, 1204, 1206, 1208, 1210, and 1212. Operation one of more of the modules 1202, 1204, 1206, 1208, 1210, and 1212 is described below with respect to the methods of FIGS. 11-15. Additionally, in various embodiments, operation one of more of the modules 1202, 1204, 1206, 1210, and 1212 is described in U.S. Pat. No. 10,741,363 with respect to the methods of FIGS. 18-22.

For further defined structure of controllers 20a, 10b, and 20' of FIG. 1 and/or various control elements of FIGS. 4 and 8, see the below provided flow charts of FIGS. 11-15, flow charts of FIGS. 18-22 of U.S. Pat. No. 10,741,363, and the below provided definition for the term "module." The systems disclosed herein may be operated using numerous methods, examples, and various control system methods, some of which are illustrated in FIGS. 11-15. Although the following operations are primarily described with respect to the implementations of FIGS. 1, 4, and 8, the operations may be easily modified to apply to other implementations of the present disclosure. The operations may be iteratively performed. Although the following operations are shown and primarily described as being performed sequentially, one or more of the following operations may be performed while one or more of the other operations are being performed.

Figure 11:
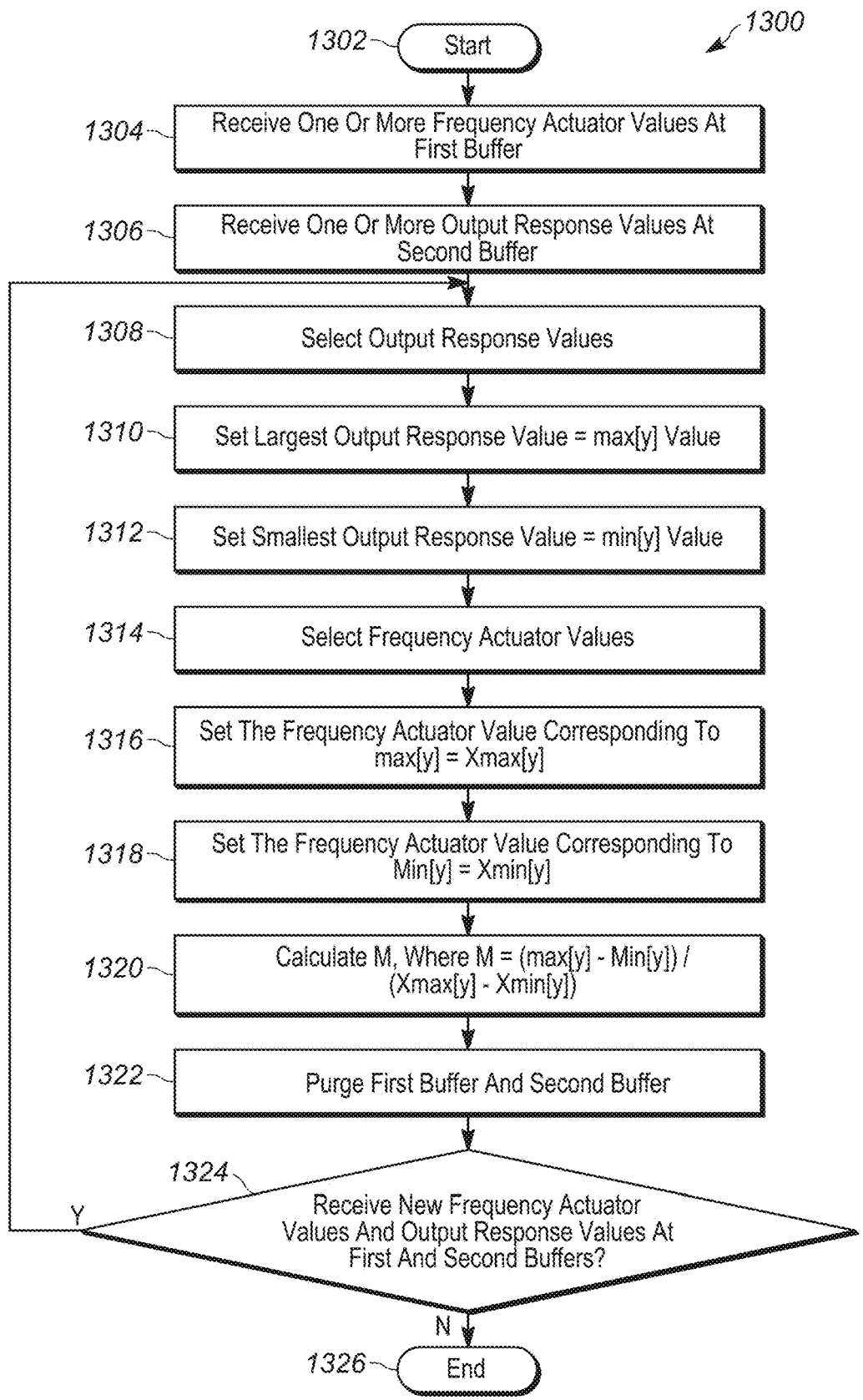
FIGS. 11-15 show flow charts of operation of control systems for gradient estimation arranged in accordance with the principals of the present disclosure.

FIG. 11 shows a flow chart of a control process 1300 for a gradient estimation in, for example, an RF generator such as RF generator 810 of FIG. 8. In control process 1300, a gradient is estimated based on minimum and maximum output response values and corresponding frequency values. Control begins at block 1302, where initialization occurs. Control proceeds to blocks 1304, 1306, where one or more frequency values and one or more output response values are received at buffers such as buffers 826, 828. Control then proceeds to blocks 1308-1312

At block 1308, control selects a set of output response values from buffer 828. At blocks 1310, 1312, control then sets the largest output response value to max[y] and the smallest output response value to min[y]. Control then proceeds to blocks 1314-1318.

At block 1314, control selects a set of frequency response values from buffer 826. At blocks 1316, 1318 control sets the frequency response value corresponding to the largest output response value to Xmax[y] and the frequency response value corresponding to the smallest output response value to Xmin[y]. Control then proceeds to block 1320.

At block 1320, control calculates an estimated gradient (or slope) of a cost function based on max[y], min[y], Xmax[y], and Xmin[y] in accordance with Equation (7) above. Control then proceeds to block 1322. At block 1322, control optionally purges some or all data in buffers 826, 828. For example, some or all frequency values and output response values stored in buffers 826, 828 may be erased, moved to another storage location, etc. In various embodiments, buffers 826, 828 can be implemented as a FIFO (first in first out) where one sample (e.g., the oldest sample) is removed for every new sample added. Control then proceeds to block 1324.

At block 1324, control determines whether any new frequency values and output response values are received, stored, etc. in buffers 826, 828. If so, control returns to block 1308, where the new output response values are selected. Otherwise, control may proceed to block 1326 thereby ending process 1300 (as shown in FIG. 11) or return to block 1324 (e.g., after waiting a period of time).

Figure 12:
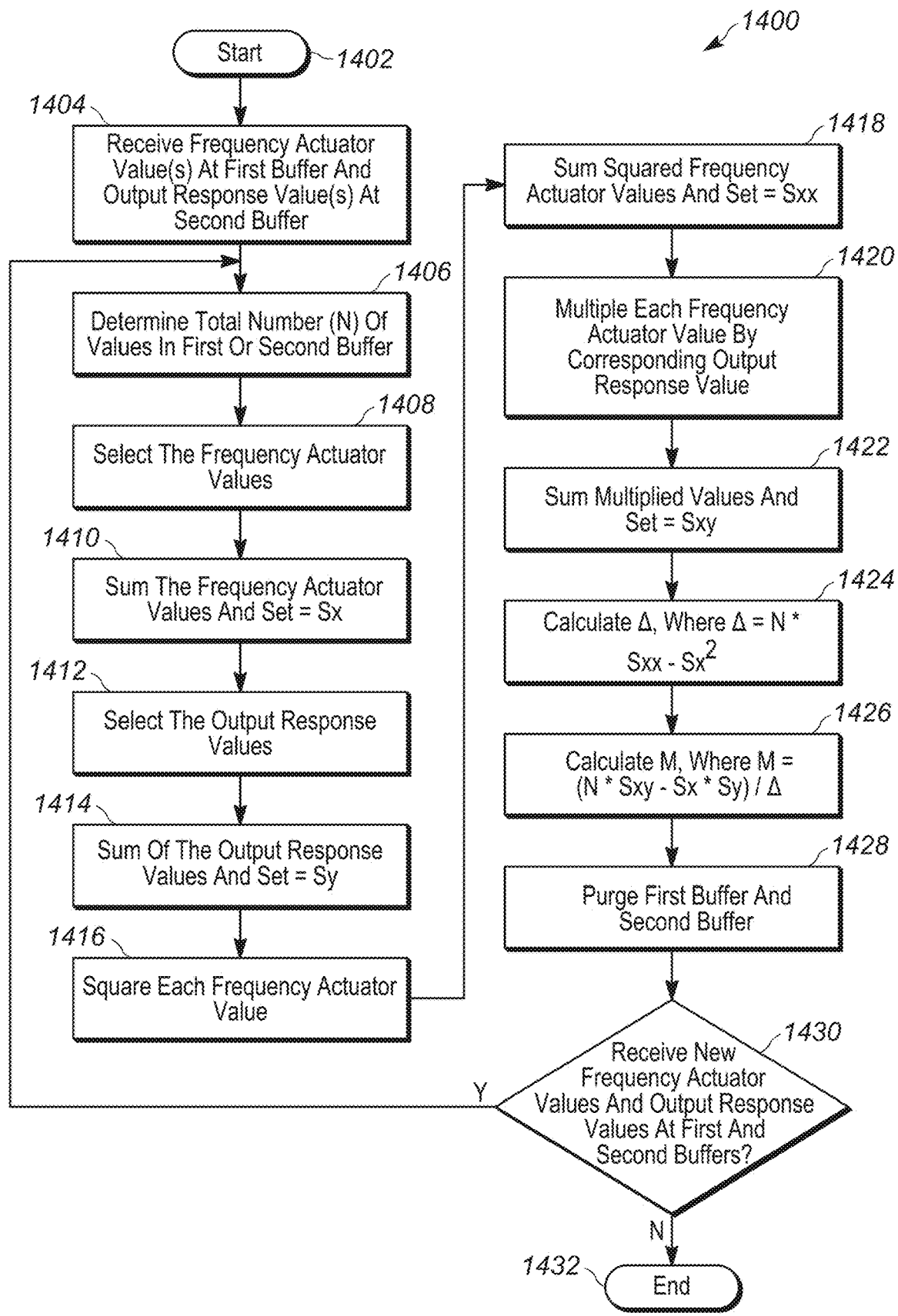

FIG. 12 shows a flow chart of a control process 1400 for another example gradient estimation in, for example, an RF generator such as RF generator 810 of FIG. 8. In control process 1400, a gradient is estimated based on various summations of stored frequency and/or output response values. Control begins at block 1402, where initialization occurs. Control proceeds to block 1404, where one or more frequency values and one or more output response values are received at first and second buffers such as buffers 826, 828. Control then proceeds to block 1406. At block 1406, control determines (e.g., counts, etc.) a total number (N) of frequency values in the first buffer such as buffer 826 or output response values in the second buffer such as buffer 828. Each buffer includes the same number of values.

Control then proceeds to blocks 1408-1426. At block 1408, control selects the frequency values from buffer 826. At block 1410, control sums the frequency values and sets the summed values to Sx in accordance with Equation (1) above. At block 1412, control selects the output response values from buffer 828. At block 1414, control sums the output response values and sets the summed values to Sy in accordance with Equation (2) above.

Control squares each frequency value in buffer 826 at block 1416, and then sums the squared values at block 1418 in accordance with Equation (3) above. Control then sets the sum of squared values to Sxx. At block 1420, control multiples each frequency value by its corresponding output response value. Control sums the multiplied values at block 1422 in accordance with Equation (4) above. Control then sets the sum of squared values to Sxy. At block 1424, control calculates delta ($\Delta$) in accordance with Equation (5) above. At block 1426, control calculates an estimated gradient (or slope) of a cost function in accordance with Equation (6) above.

Control then proceeds to block 1428, where data in buffers 826, 828 is optionally purged as explained above with reference to, for example, block 1322 of FIG. 11. Control then proceeds to block 1430.

At block 1430, control determines whether any new frequency and output response values are received, stored, etc. at buffers 826, 828. If so, control returns to block 1406. Otherwise, control may proceed to block 1432 thereby ending process 1400 (as shown in FIG. 12) or return to block 1430 (e.g., after waiting a period of time).

Figure 13:
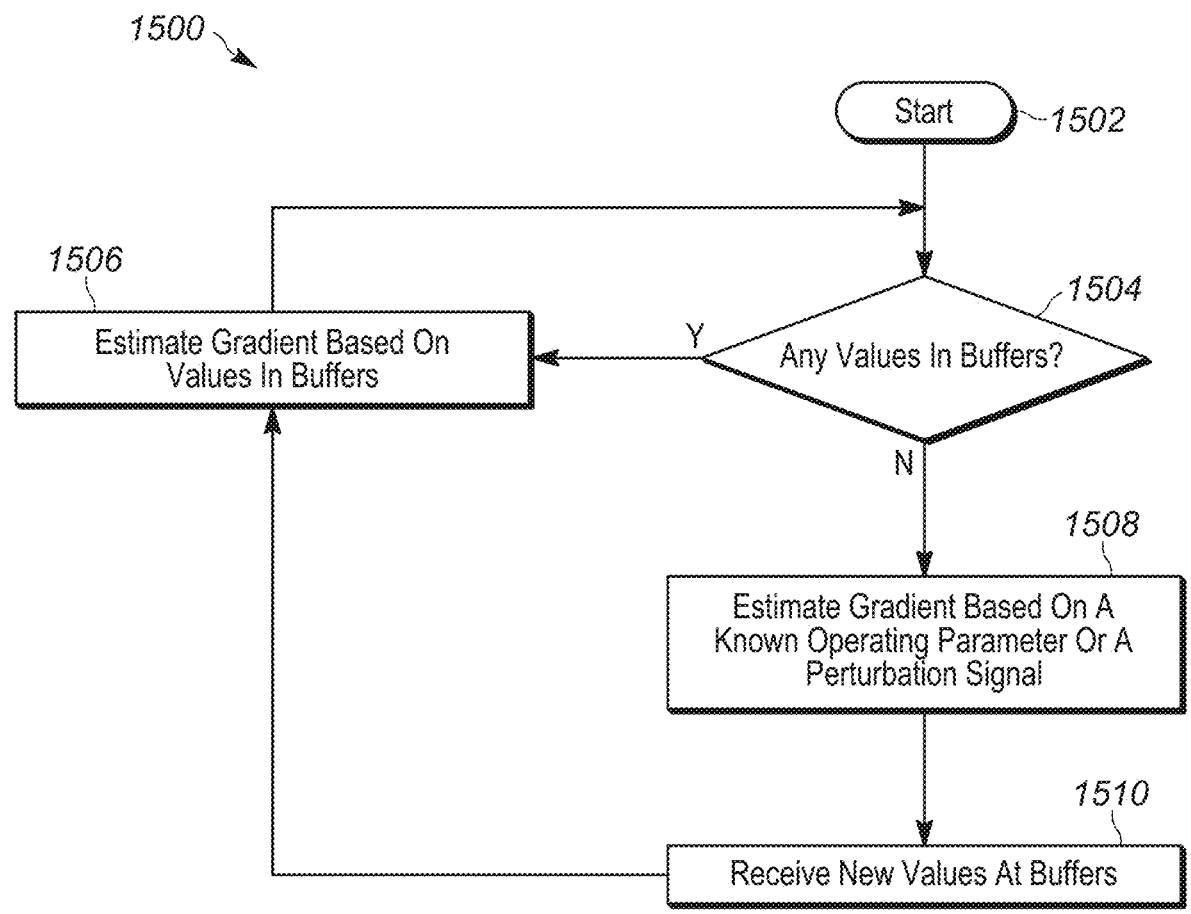

FIG. 13 shows a flow chart of a control process 1500 for a gradient estimation in, for example, an RF generator such as RF generator 810 of FIG. 8 when buffers 826, 828 are empty. Control begins at block 1502, where initialization occurs. Control proceeds to block 1504.

At block 1504, control determines whether buffers 826, 828 include any frequency and output response values. For example, and as explained above, buffers 826, 828 may be empty (e.g., without frequency and output response values) at startup of RF generator 810, after a purge of data, after pulse condition changes, after a transitioning from a continuous wave mode to a pulse mode, etc. If buffers 826, 828 contain values, control proceeds to block 1506.

At block 1506, control estimates a gradient of a cost function based on the stored frequency and output response values. This may be done in accordance with any one of the gradient estimation examples described herein. Control then returns to block 1504.

If buffers 826, 828 do not contain values at block 1504, control proceeds to block 1508. At block 1508, control estimates a gradient of a cost function in accordance with another suitable manner. For example, a gradient may be estimated based on one or more defined operating parameters, a series of perturbations (e.g., white noise, etc.), etc. as explained herein. Control then proceeds to block 1510.

At block 1510, control receives new frequency and output response values at buffers 826, 828. Control then returns to block 1506, where control estimates a new gradient of the cost function based on the newly stored frequency and output response values.

Figure 14:
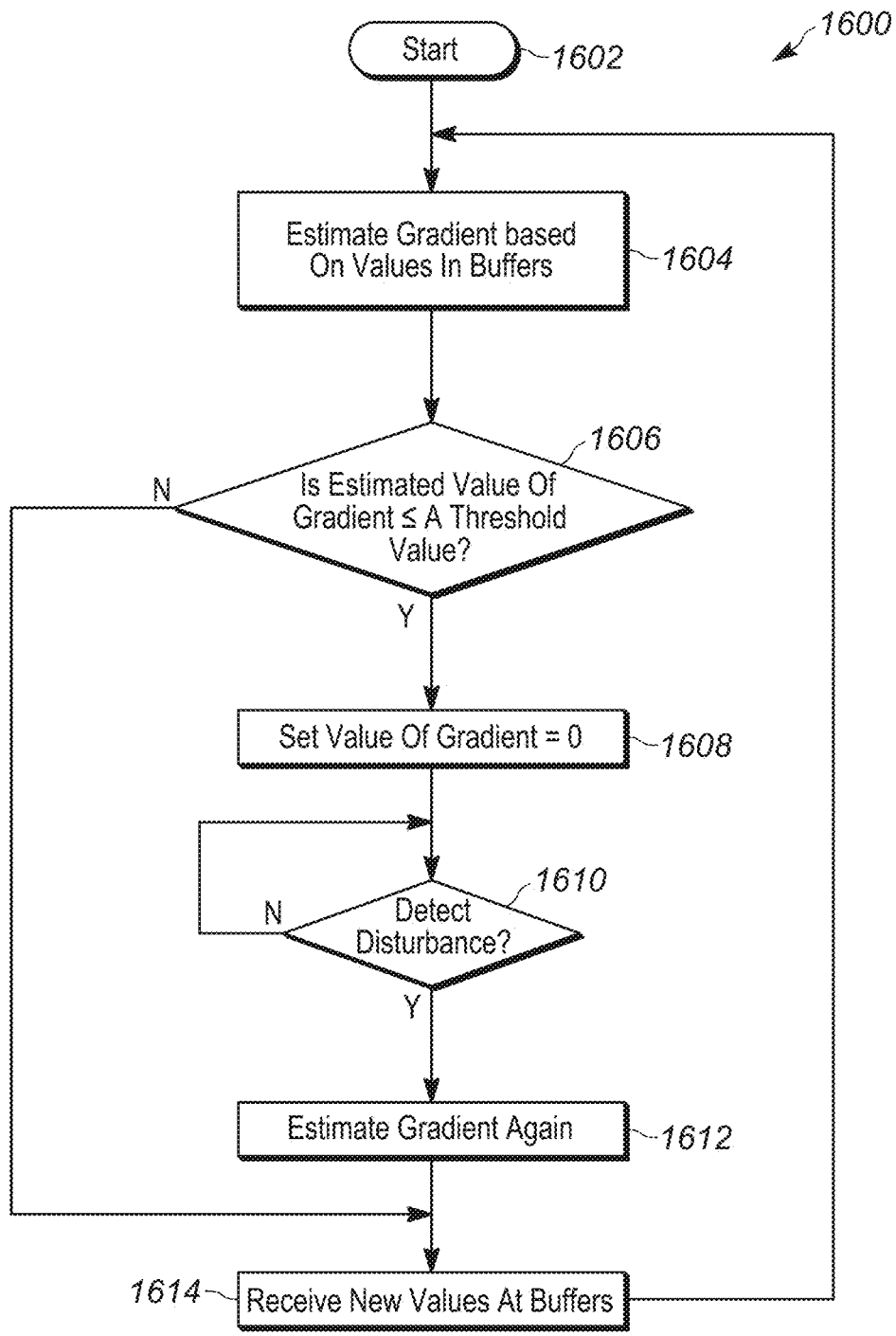

FIG. 14 shows a flow chart of a control process 1600 for a gradient estimation in, for example, an RF generator such as RF generator 810 of FIG. 8 when output response reaches or nears an optimal point (e.g., a minimum or maximum point of a cost function). Control begins at block 1602, where initialization occurs. Control proceeds to block 1604, where a gradient of a cost function is estimated based on stored frequency and output response values as explained herein. Control then proceeds to block 1606.

At block 1606, control determines whether the estimated gradient is less than or equal to a defined threshold value. If not, control proceeds to block 1614. Otherwise, control proceeds to block 1608, where a value of the gradient is set to zero. Control then proceeds to block 1610.

At block 1610, control detects whether a disturbance has occurred in the system. For example, control may determine whether the output response has moved away from its optimal point. In various embodiments, control may make this determination based on whether the output response has moved away from its optimal point by a defined threshold value, as explained herein. If not, control returns to block 1610. Otherwise, control proceeds to block 1612.

At block 1612, control estimates a gradient again. For example, at block 1612, control may estimate the gradient based on the last gradient value estimated before the gradient was set to zero at block 1608. In other embodiments, a gradient may be estimated at block 1612 based on one or more defined operating parameters, a series of perturbations (e.g., white noise, etc.) as explained herein.

Control then proceeds to block 1614. At block 1614, control receives new frequency and output response values at buffers 826, 828. Control then returns to block 1604, where control estimates a new gradient of the cost function based on the newly stored frequency and output response values.

Figure 15:
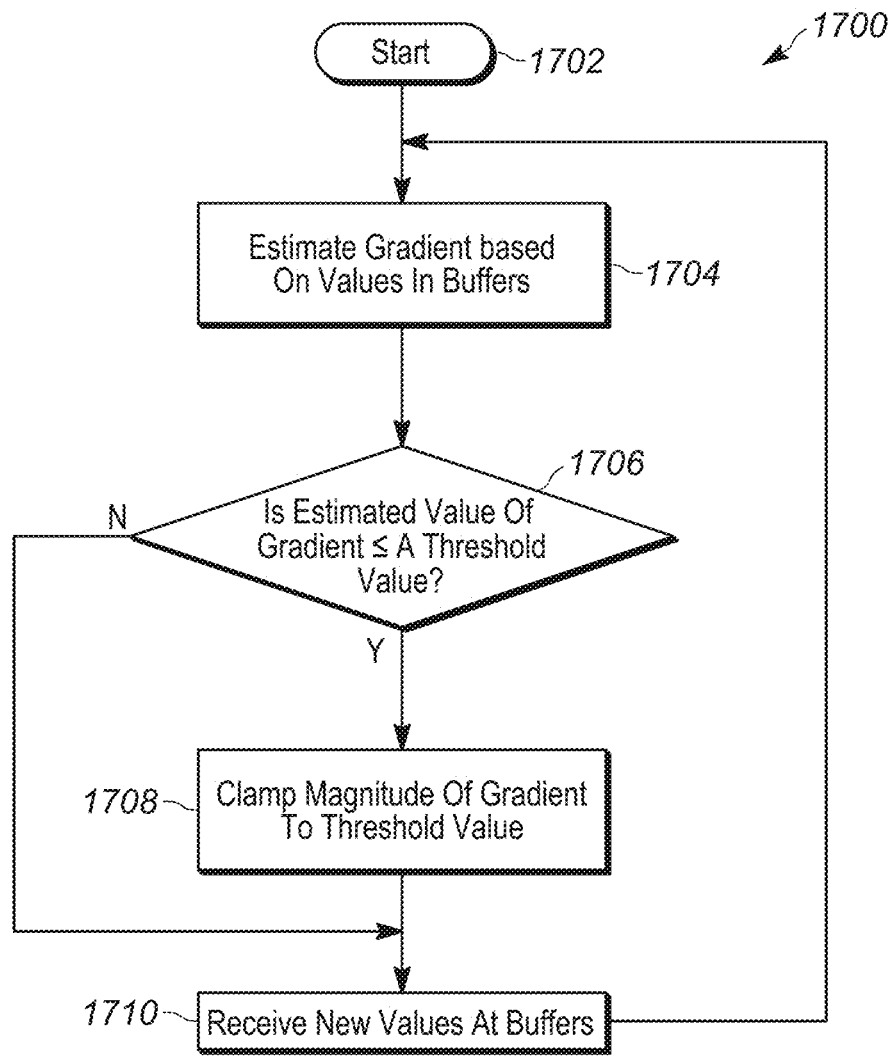

FIG. 15 shows a flow chart of a control process 1600 for another gradient estimation in, for example, an RF generator such as RF generator 810 of FIG. 8 when output response reaches or nears an optimal point (e.g., a minimum or maximum point of a cost function). Control begins at block 1702, where initialization occurs. Control proceeds to block 1704, where a gradient of a cost function is estimated based on stored frequency and output response values as explained herein. Control then proceeds to block 1706.

At block 1706, control determines whether the estimated gradient is less than or equal to a defined threshold value. If not, control proceeds to block 1710. Otherwise, control proceeds to block 1708, where the magnitude of the estimated gradient is clamped to the threshold value. This effectively causes the frequency of control signal $u_{esc}^{f}$ to dither around a target frequency (corresponding to a minimum or maximum point of the output response). Control then proceeds to block 1710.

At block 1710, control receives new frequency and output response values at buffers 826, 828. Control then returns to block 1704, where control estimates a new gradient of the cost function based on the newly stored frequency and output response values.

The systems and methods described herein may, in various configurations, provide one or more of the following advantages. For example, the systems and methods described herein may enable the estimation of a gradient for ESC-based frequency tuning control through the use of stored frequency and output response values, rather than with a persistent sinusoidal perturbation signal as in typical approaches. As a result, the systems and methods improve transient tune time for ESC-based frequency tuning as compared to the typical approaches. This improved transient tune time is true for all pulsing conditions, including low duty cycle pulsing. Additionally, the systems and methods improve (and sometimes eliminate) a steady-state dither (or oscillation) of the frequency actuator and the output response (gamma mag squared) as compared to the typical approaches. Further, the systems and methods reduce the sensitivity of the ESC frequency tuner to other frequency content in the system as compared to the typical approaches, while also not distributing power control loops. The systems and methods also simplify the implementation and tuning of the ESC-based approaches by eliminating the need for the sinusoidal perturbation signal and associated demodulation methods in the feedback signal chain associated with the sinusoidal perturbation signal (e.g., a demodulator with proper phase delay, high pass filter, etc.).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. In the written description and claims, one or more steps within a method may be executed in a different order (or concurrently) without altering the principles of the present disclosure. Similarly, one or more instructions stored in a non-transitory computer-readable medium may be executed in a different order (or concurrently) without altering the principles of the present disclosure. Unless indicated otherwise, numbering or other labeling of instructions or method steps is done for convenient reference, not to indicate a fixed order.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

The phrase "at least one of A, B, and C" should be construed to mean a logical (A OR B OR C), using a non-exclusive logical OR, and should not be construed to mean "at least one of A, at least one of B, and at least one of C." The term "set" does not necessarily exclude the empty set—in other words, in some circumstances a "set" may have zero elements. The term "non-empty set" may be used to indicate exclusion of the empty set — in other words, a non-empty set will always have one or more elements. The term "subset" does not necessarily require a proper subset. In other words, a "subset" of a first set may be coextensive with (equal to) the first set. Further, the term "subset" does not necessarily exclude the empty set—in some circumstances a "subset" may have zero elements.

In the figures, the direction of an arrow, as indicated by the arrowhead, generally demonstrates the flow of information (such as data or instructions) that is of interest to the illustration. For example, when element A and element B exchange a variety of information, but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" can be replaced with the term "controller" or the term "circuit." In this application, the term "controller" can be replaced with the term "module." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); processor hardware (shared, dedicated, or group) that executes code; memory hardware (shared, dedicated, or group) that stores code executed by the processor hardware; other suitable hardware components that provide the described functionality; or a combination of some or all of the above, such as in a system-on-chip.

The module may include one or more interface circuits. In some examples, the interface circuit(s) may implement wired or wireless interfaces that connect to a local area network (LAN) or a wireless personal area network (WPAN). Examples of a LAN are Institute of Electrical and Electronics Engineers (IEEE) Standard 802.11-2020 (also known as the WIFI wireless networking standard) and IEEE Standard 802.3-2018 (also known as the ETHERNET wired networking standard). Examples of a WPAN are IEEE Standard 802.15.4 (including the ZIGBEE standard from the ZigBee Alliance) and, from the Bluetooth Special Interest Group (SIG), the BLUETOOTH wireless networking standard (including Core Specification versions 3.0, 4.0, 4.1, 4.2, 5.0, and 5.1 from the Bluetooth SIG).

The module may communicate with other modules using the interface circuit(s). Although the module may be depicted in the present disclosure as logically communicating directly with other modules, in various implementations the module may actually communicate via a communications system. The communications system includes physical and/or virtual networking equipment such as hubs, switches, routers, and gateways. In some implementations, the communications system connects to or traverses a wide area network (WAN) such as the Internet. For example, the communications system may include multiple LANs connected to each other over the Internet or point-to-point leased lines using technologies including Multiprotocol Label Switching (MPLS) and virtual private networks (VPNs).

In various implementations, the functionality of the module may be distributed among multiple modules that are connected via the communications system. For example, multiple modules may implement the same functionality distributed by a load balancing system. In a further example, the functionality of the module may be split between a server (also known as remote, or cloud) module and a client (or, user) module. For example, the client module may include a native or web application executing on a client device and in network communication with the server module.

Some or all hardware features of a module may be defined using a language for hardware description, such as IEEE Standard 1364-2005 (commonly called "Verilog") and IEEE Standard 1076-2008 (commonly called "VHDL"). The hardware description language may be used to manufacture and/or program a hardware circuit. In some implementations, some or all features of a module may be defined by a language, such as IEEE 1666-2005 (commonly called "SystemC"), that encompasses both code, as described below, and hardware description.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

The memory hardware may also store data together with or separate from the code. Shared memory hardware encompasses a single memory device that stores some or all code from multiple modules. One example of shared memory hardware may be level 1 cache on or near a microprocessor die, which may store code from multiple modules. Another example of shared memory hardware may be persistent storage, such as a solid state drive (SSD), which may store code from multiple modules. Group memory hardware encompasses a memory device that, in combination with other memory devices, stores some or all code from one or more modules. One example of group memory hardware is a storage area network (SAN), which may store code of a particular module across multiple physical devices. Another example of group memory hardware is random access memory of each of a set of servers that, in combination, store code of a particular module.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. Such apparatuses and methods may be described as computerized apparatuses and computerized methods. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Swift, Haskell, Go, SQL, R, Lisp, Java®, Fortran, Perl, Pascal, Curl, OCaml, JavaScript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A radio frequency (RF) generator for powering a load, the RF generator comprising:
a RF power source configured to generate an output signal at an output frequency;
an extremum-seeking frequency controller configured to generate a frequency control signal, the frequency control signal varying the output frequency of the RF power source, the frequency control signal is formed from a gradient signal; and
a gradient estimator configured to generate the gradient signal,
wherein a frequency of the frequency control signal is adjusted based on the gradient signal,
wherein the gradient estimator is configured to receive frequency values of the frequency control signal and corresponding output response values, and
wherein the gradient signal is generated based on the frequency values and the output response values.

2. The RF generator of claim 1, further comprising a first buffer configured to store the frequency values and a second buffer configured to store the output response values.

3. The RF generator of claim 2, wherein the first buffer and the second buffer are configured to purge at least one of the frequency values and at least one of the output response values.

4. The RF generator of claim 2, wherein the first buffer and the second buffer are configured to store a defined number of the frequency values and the output response values.

5. The RF generator of claim 4, wherein the defined number is a number from five to twenty.

6. The RF generator of claim 2, further comprising a power controller coupled to the RF power source, the power controller configured to generate a pulse to modulate the output signal of the RF power source, wherein the first buffer and the second buffer are configured to store the frequency values and the output response values for the pulse.

7. The RF generator of claim 2, further comprising a power controller coupled to the RF power source, the power controller configured to generate a pulse to modulate the output signal of the RF power source, wherein:
the pulse includes a first state and a second state; and
the first buffer and the second buffer are configured to store the frequency values and the output response values for the first state of the pulse.

8. The RF generator of claim 7, further comprising a third buffer configured to store the frequency values for the second state of the pulse and a fourth buffer configured to store the output response values for the second state of the pulse.

9. The RF generator of claim 7, wherein:
the first buffer and the second buffer are configured to purge at least one of the frequency values and at least one of the output response values for the first state of the pulse; and
the first buffer and the second buffer are configured to store the frequency values and the output response values for the second state of the pulse after purging the at least one of the frequency values and the at least one of the output response values for the first state of the pulse.

10. The RF generator of claim 9, wherein:
the pulse is a first pulse;
the power controller is configured to generate a second pulse including the first state and the second state; and
the at least one of the frequency values and the at least one of the output response values purged for the first state of the first pulse are recalled into the first buffer and the second buffer for the first state of the second pulse.

11. The RF generator of claim 1, wherein:
the gradient estimator is configured to estimate a gradient of a cost function of the RF generator based on the frequency values and the output response values; and
the gradient estimator is configured to generate the gradient signal based on the estimated gradient.

12. The RF generator of claim 11, wherein the gradient estimator is configured to estimate the gradient based on a minimum value of the output response values, a maximum value of the output response values, one of the frequency values corresponding to the minimum value of the output response values, and another one of the frequency values corresponding to the maximum value of the output response values.

13. The RF generator of claim 11, wherein the gradient estimator is configured to estimate the gradient based on a sum of the frequency values and a sum of the output response values.

14. The RF generator of claim 11, wherein the gradient estimator is configured to set the estimated gradient to zero in response to the estimated gradient being less than or equal to a defined threshold value.

15. The RF generator of claim 14, wherein the gradient estimator is configured to estimate the gradient again based on at least one of: one of the output response values corresponding to when the estimated gradient was set to zero, one or more defined operating parameters of the RF generator, or a perturbation signal.

16. The RF generator of claim 11, wherein the gradient estimator is configured to clamp the estimated gradient to a defined threshold value in response to the estimated gradient being less than or equal to the defined threshold value.

17. The RF generator of claim 1, wherein:
the gradient estimator is configured to estimate a gradient at startup of the RF generator based on one or more defined operating parameters of the RF generator or a perturbation signal; and
the gradient estimator is configured to generate the gradient signal based on the estimated gradient.

18. A control system for controlling a radio frequency (RF) generator including a RF power source, the control system comprising:
an extremum-seeking frequency controller configured to generate a frequency control signal, the frequency control signal varying an output frequency of the RF power source, the frequency control signal is formed from a gradient signal; and
a gradient estimator configured to generate the gradient signal, wherein a frequency of the frequency control signal is adjusted based on the gradient signal,
wherein the gradient estimator is configured to receive frequency values of the frequency control signal and corresponding output response values, and
wherein the gradient signal is generated based on the frequency values and the output response values.

19. The control system of claim 18, further comprising a first buffer configured to store the frequency values and a second buffer configured to store the output response values.

20. The control system of claim 19, wherein the first buffer and the second buffer are configured to purge at least one of the frequency values and at least one of the output response values.

21. The control system of claim 19, wherein the first buffer and the second buffer are configured to store a defined number of the frequency values and the output response values.

22. The control system of claim 21, wherein the defined number is a number from five to twenty.

23. The control system of claim 19, further comprising a power controller configured to generate a pulse to modulate an output signal of the RF power source, wherein the first buffer and the second buffer are configured to store the frequency values and the output response values for the pulse.

24. The control system of claim 19, further comprising a power controller configured to generate a pulse to modulate an output signal of the RF power source, wherein:
the pulse includes a first state and a second state; and
the first buffer and the second buffer are configured to store the frequency values and the output response values for the first state of the pulse.

25. The control system of claim 24, further comprising a third buffer configured to store the frequency values for the second state of the pulse and a fourth buffer configured to store the output response values for the second state of the pulse.

26. The control system of claim 24, wherein:
the first buffer and the second buffer are configured to purge at least one of the frequency values and at least one of the output response values for the first state of the pulse; and
the first buffer and the second buffer are configured to store the frequency values and the output response values for the second state of the pulse after purging the at least one of the frequency values and the at least one of the output response values for the first state of the pulse.

27. The control system of claim 26, wherein:
the pulse is a first pulse;
the power controller is configured to generate a second pulse including the first state and the second state; and
the at least one of the frequency values and the at least one of the output response values purged for the first state of the first pulse are recalled into the first buffer and the second buffer for the first state of the second pulse.

28. The control system of claim 18, wherein:
the gradient estimator is configured to estimate a gradient of a cost function of the RF generator based on the frequency values and the output response values; and
the gradient estimator is configured to generate the gradient signal based on the estimated gradient.

29. The control system of claim 28, wherein the gradient estimator is configured to estimate the gradient based on a minimum value of the output response values, a maximum value of the output response values, one of the frequency values corresponding to the minimum value of the output response values, and another one of the frequency values corresponding to the maximum value of the output response values.

30. The control system of claim 28, wherein the gradient estimator is configured to estimate the gradient based on a sum of the frequency values and a sum of the output response values.

31. The control system of claim 28, wherein the gradient estimator is configured to set the estimated gradient to zero in response to the estimated gradient being less than or equal to a defined threshold value.

32. The control system of claim 31, wherein the gradient estimator is configured to estimate the gradient again based on at least one of: one of the output response values corresponding to when the estimated gradient was set to zero, one or more defined operating parameters of the RF generator, or a perturbation signal.

33. The control system of claim 28, wherein the gradient estimator is configured to clamp the estimated gradient to a defined threshold value in response to the estimated gradient being less than or equal to the defined threshold value.

34. The control system of claim 18, wherein:
the gradient estimator is configured to estimate a gradient at startup of the RF generator based on one or more defined operating parameters of the RF generator or a perturbation signal; and
the gradient estimator is configured to generate the gradient signal based on the estimated gradient.

* * * * *